(12) United States Patent
Takahashi et al.

(10) Patent No.: US 8,999,818 B2
(45) Date of Patent: Apr. 7, 2015

(54) SEMICONDUCTOR DEVICE AND METHOD OF MANUFACTURING SEMICONDUCTOR DEVICE

(75) Inventors: Hidekazu Takahashi, Tochigi (JP); Daiki Yamada, Gunma (JP); Yohei Monma, Tochigi (JP); Hiroki Adachi, Tochigi (JP); Shunpei Yamazaki, Tokyo (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 187 days.

(21) Appl. No.: 12/342,153

(22) Filed: Dec. 23, 2008

(65) Prior Publication Data

US 2009/0174023 A1 Jul. 9, 2009

(30) Foreign Application Priority Data

Dec. 28, 2007 (JP) .................. 2007-340013

(51) Int. Cl.
*H01L 21/00* (2006.01)
*H01L 27/146* (2006.01)
*H01L 27/12* (2006.01)

(52) U.S. Cl.
CPC ...... *H01L 27/14687* (2013.01); *H01L 27/1214* (2013.01); *H01L 27/14692* (2013.01); *H01L 27/12* (2013.01)

(58) Field of Classification Search
CPC ............ H01L 27/14687; H01L 27/1214; H01L 27/14692; H01L 27/12
USPC ........... 257/458, E31.061, E21.238; 438/460, 438/462, 464, 465
See application file for complete search history.

(56) References Cited

U.S. PATENT DOCUMENTS

| 4,851,371 | A | 7/1989 | Fisher et al. |
|---|---|---|---|
| 5,261,156 | A | 11/1993 | Mase et al. |
| 5,401,330 | A | 3/1995 | Saito et al. |
| 5,757,456 | A | 5/1998 | Yamazaki et al. |
| 5,834,327 | A | 11/1998 | Yamazaki et al. |

(Continued)

FOREIGN PATENT DOCUMENTS

| CN | 1577876 | 2/2005 |
|---|---|---|
| EP | 0376514 A | 7/1990 |

(Continued)

OTHER PUBLICATIONS

European Search Report (Application No. 08022051.0) Dated Feb. 8, 2011.

(Continued)

*Primary Examiner* — Colleen A Matthews
*Assistant Examiner* — Colleen E Snow
(74) *Attorney, Agent, or Firm* — Eric J. Robinson; Robinson Intellectual Property Law Office, P.C.

(57) ABSTRACT

A semiconductor element is formed on a first surface of the substrate. A resin layer is formed over a second surface of the substrate which is opposite to the first surface of the substrate and on a part of the side surface of the substrate. A step is formed on the side surface of the substrate. The width of the upper section of the substrate with a step is narrower than the lower section of the substrate with a step. Therefore, the substrate can also be a protrusion.

13 Claims, 16 Drawing Sheets
(1 of 16 Drawing Sheet(s) Filed in Color)

(56) References Cited

U.S. PATENT DOCUMENTS

| | | |
|---|---|---|
| 5,910,687 A | 6/1999 | Chen et al. |
| 6,118,502 A | 9/2000 | Yamazaki et al. |
| 6,221,751 B1 | 4/2001 | Chen et al. |
| 6,362,866 B1 | 3/2002 | Yamazaki et al. |
| 6,580,152 B2 | 6/2003 | Hasegawa |
| 6,855,961 B2 | 2/2005 | Maruyama et al. |
| 6,882,012 B2 | 4/2005 | Yamazaki et al. |
| 6,900,873 B2 | 5/2005 | Yamazaki et al. |
| 7,050,138 B1 | 5/2006 | Yamazaki et al. |
| 7,067,395 B2 | 6/2006 | Maruyama et al. |
| 7,214,555 B2 | 5/2007 | Yamazaki et al. |
| 7,271,858 B2 | 9/2007 | Yamazaki et al. |
| 7,316,937 B2 | 1/2008 | Kojima et al. |
| 7,352,044 B2 | 4/2008 | Yamada et al. |
| 7,446,843 B2 | 11/2008 | Yamazaki et al. |
| 7,598,154 B2 | 10/2009 | Izumi |
| 7,642,113 B2 * | 1/2010 | Kurosawa ............... 438/33 |
| 7,705,283 B2 | 4/2010 | Arao et al. |
| 7,728,445 B2 | 6/2010 | Nakamura et al. |
| 7,768,086 B2 | 8/2010 | Shibayama |
| 7,772,667 B2 | 8/2010 | Sugawara et al. |
| 7,833,881 B2 * | 11/2010 | Farnworth ............. 438/460 |
| 7,923,297 B2 | 4/2011 | Izumi |
| 8,138,004 B2 | 3/2012 | Sugawara et al. |
| 8,207,591 B2 | 6/2012 | Sugawara et al. |
| 8,263,926 B2 | 9/2012 | Arao et al. |
| 2003/0071953 A1 | 4/2003 | Yamazaki et al. |
| 2003/0134453 A1 | 7/2003 | Prabhu et al. |
| 2003/0207496 A1 | 11/2003 | Hasegawa |
| 2004/0076797 A1 | 4/2004 | Zilber et al. |
| 2004/0113283 A1 * | 6/2004 | Farnworth et al. ........ 257/782 |
| 2004/0245530 A1 | 12/2004 | Kameyama et al. |
| 2004/0263712 A1 | 12/2004 | Yamazaki et al. |
| 2004/0266051 A1 | 12/2004 | Kojima et al. |
| 2005/0009298 A1 * | 1/2005 | Suzuki et al. ............. 438/459 |
| 2005/0052584 A1 | 3/2005 | Yamazaki et al. |
| 2005/0070038 A1 | 3/2005 | Yamazaki et al. |
| 2005/0121672 A1 | 6/2005 | Yamazaki et al. |
| 2005/0157242 A1 | 7/2005 | Yamazaki et al. |
| 2006/0044300 A1 | 3/2006 | Koyama et al. |
| 2006/0065960 A1 | 3/2006 | Maruyama et al. |
| 2006/0270195 A1 * | 11/2006 | Yamada et al. ............. 438/460 |
| 2007/0026639 A1 | 2/2007 | Noma et al. |
| 2007/0034995 A1 | 2/2007 | Kameyama et al. |
| 2007/0115416 A1 | 5/2007 | Yamazaki et al. |
| 2007/0190691 A1 | 8/2007 | Humpston et al. |
| 2007/0259585 A1 | 11/2007 | Yamazaki et al. |
| 2008/0188022 A1 | 8/2008 | Yamazaki et al. |
| 2009/0001256 A1 | 1/2009 | Yanagisawa et al. |
| 2009/0002532 A1 * | 1/2009 | Nishida et al. ............ 348/294 |
| 2009/0004764 A1 | 1/2009 | Ohnuma et al. |
| 2009/0050964 A1 * | 2/2009 | Dozen et al. .............. 257/347 |
| 2009/0166896 A1 | 7/2009 | Yamazaki et al. |
| 2009/0183766 A1 | 7/2009 | Takahashi et al. |
| 2009/0194154 A1 | 8/2009 | Takahashi et al. |
| 2009/0267173 A1 | 10/2009 | Takahashi et al. |

FOREIGN PATENT DOCUMENTS

| | | |
|---|---|---|
| EP | 1653520 A | 5/2006 |
| EP | 1724844 A | 11/2006 |
| EP | 1727120 A | 11/2006 |
| JP | 63-033622 A | 2/1988 |
| JP | 01-145143 A | 10/1989 |
| JP | 01-145143 U | 10/1989 |
| JP | 02-212162 A | 8/1990 |
| JP | 06-204336 A | 7/1994 |
| JP | 07-014880 A | 1/1995 |
| JP | 08-250745 A | 9/1996 |
| JP | 08-264796 A | 10/1996 |
| JP | 2001-035972 A | 2/2001 |
| JP | 2001-064029 | 3/2001 |
| JP | 2002-064112 A | 2/2002 |
| JP | 2002-100709 A | 4/2002 |
| JP | 2003-060120 A | 2/2003 |
| JP | 2003-255386 A | 9/2003 |
| JP | 2004-349275 A | 12/2004 |
| JP | 2005-216941 A | 8/2005 |
| JP | 2006-261299 A | 9/2006 |
| JP | 2007-005774 A | 1/2007 |
| JP | 2007-134454 A | 5/2007 |
| JP | 2007-194469 A | 8/2007 |
| TW | 200503260 | 1/2005 |
| TW | 200511569 | 3/2005 |
| TW | 200742106 | 11/2007 |
| WO | WO-98/33215 | 7/1998 |

OTHER PUBLICATIONS

Chinese Office Action (Application No. 200810189707.6) Dated Aug. 17, 2011.

Taiwanese Office Action (Application No. 97151069) Dated Oct. 22, 2014.

US 7,359,010, 04/2008, Yamazaki et al. (withdrawn)

* cited by examiner

SEMICONDUCTOR DEVICE AND METHOD OF MANUFACTURING SEMICONDUCTOR DEVICE

BACKGROUND OF THE INVENTION

1. Field of the Invention

The present invention relates to a semiconductor device and a method for manufacturing the semiconductor device. The present invention particularly relates to a photoelectric conversion device as the semiconductor device.

2. Description of the Related Art

Photoelectric conversion devices which detect visible light having a wavelength range of from 400 nm to 700 nm are referred to as optical sensors or visible light sensors as one mode of the photoelectric conversion device. Applications of the optical sensor or the visible light sensor such as detecting a light signal and read information, and detecting brightness of the ambient environment and control operation of electronic devices or the like are known.

For example, an optical sensor is used in a cellular phone or a television device so that brightness of a display screen is adjusted according to brightness of the ambient environment of the cellular phone or the television device (see Patent Document 1: Japanese Published Patent Application No. 2001-64029).

Such a semiconductor device, for example, the optical sensor or the visible light sensor, is formed in such a manner that transistors are formed over a substrate such as glass, a wafer, or the like, and the substrate is cut (divided).

In many cases, a substrate is divided as follows. First, a groove (also referred to as a scribe line) is formed on the surface of the substrate by using a scribing apparatus. Then, the substrate is forced to be divided along the groove by using a cutting apparatus. Alternatively, in the division of the substrate using a laser beam, the substrate is selectively irradiated with a laser beam for being locally heated. Then, the surface of the substrate which is heated is cooled by a refrigerant. Subsequently, a crack is formed by utilizing thermal stress which is generated in the substrate, and thus the substrate is divided (for example see Patent Document 1: Japanese Published Patent Application No. 2001-64029).

SUMMARY OF THE INVENTION

When a substrate is divided by using a scribing apparatus, there is a case where a groove is not formed in a desired shape due to a layer which is provided over the surface of the substrate. As a result, the substrate cannot be divided into desired shapes, which results in reduction in yield. In addition, since the substrate is divided by pressure, a crack is easily formed form a groove, which has adversely affected the divided surface. Such a problem of appearance of the divided surface causes reduction in yield. Occurrence frequency of a split and a chip as well as a crack increases as the substrate becomes thinner and as the strength is weaken.

In addition, as a scribing apparatus, a dicer or the like are often used, and a blade of such a dicer or the like (a dicing blade) are worn away after it is used more than once, so that it is necessary to replace it. Since a dicing blade is expensive, reduction in manufacturing cost is difficult.

In addition, in the division of the substrate with a laser beam, the substrate is transformed due to heating of the substrate. In addition, stress remains inside the substrate, whereby a crack occurs in the substrate.

Thus, an object of the present invention is that a substrate provided with a semiconductor device is made to be thin. Another object of the present invention is that manufacturing yield of an element substrate which is made to be thin increases. Yet another object of the present invention is that manufacturing cost of an element substrate which is made to be thin is reduced.

In the present invention, a large-sized substrate is divided into each semiconductor element, so that a plurality of semiconductor devices are formed in the chip form. In the method for dividing of the present invention, first, a substrate is processed to be thin, whereby the time for dividing and wear-out of the process means such as a dicer used for dividing are reduced. Further, the dividing step is not performed at a time. First, a groove for dividing semiconductor elements is formed on the substrate, and a resin layer is formed over the substrate provided with a groove. After that, the resin layer and the substrate are cut along the groove, and a plurality of semiconductor devices are formed by division (separation).

Thus, in one aspect of the semiconductor device of the present invention, a semiconductor element is formed on a first surface of the substrate. A resin layer is formed over a second surface of the substrate which is opposite to the first surface of the substrate and on a part of the side surface of the substrate. A step is formed on the side surface of the substrate. The width of the upper section of the substrate with a step is narrower than the lower section of the substrate with a step. Therefore, the substrate can have a protrusion. The cross-section of the substrate can also be described as an upside-down T shape. The upside-down T shape has only to substantively have a shape like T.

Alternatively, in one aspect of the semiconductor device of the present invention, a semiconductor element is formed on a first surface of the substrate. A resin layer is formed over a second surface of the substrate opposite to the first surface of the substrate and on a part of the side surface of the substrate. The cross-section of the substrate is a trapezoid with a stepped side surface, and the thickness of the upper section of the stepped trapezoid is larger than that of the lower section of it. Depending on the shape of a groove, the trapezoid curves from the upper section to the lower section.

In the above structure, in one mode of the semiconductor device, a side surface of the substrate in contact with a resin layer includes a curved surface which spreads toward the bottom. In addition, a bottom surface of the substrate and a top surface of the substrate are quadrangles, and the area of the bottom surface is larger than the area of the top surface.

Since a semiconductor device of the present invention has a distinctive shape as described above, the front and the back of the semiconductor device are easily distinguished. Therefore, the misidentification of a semiconductor device in an automatic operation by a machine can be reduced.

Further, the semiconductor element includes a photoelectric conversion device which includes a photoelectric conversion element and an amplifier circuit for amplifying the output of the photoelectric conversion element. The photoelectric conversion element may include a stacked layer structure formed of a p-type semiconductor layer, an i-type semiconductor layer, and an n-type semiconductor layer.

In this specification, an i-type semiconductor corresponds to the semiconductor in which the concentration of an impurity which imparts p-type or n-type conductivity is $1 \times 10^{20}$ $cm^{-3}$ or less; the concentration of oxygen and nitrogen is $1 \times 10^{20}$ $cm^{-3}$ or less; and photoconductivity exceeds dark conductivity by 100 times or more. The i-type semiconductor is formed of a material which includes an impurity element which belongs to group 13 or group 15 of the periodic table. That is, i-type semiconductor shows weak n-type electric conductivity when an impurity element for controlling valence electrons is not added intentionally. Therefore, an impurity imparting p-type conductivity may be added to an i-type semiconductor layer intentionally or unintentionally at the time of film formation or after the formation.

In one mode of a method for manufacturing a semiconductor device of the present invention, the following steps are included: a step in which a semiconductor element is formed on a first surface of a substrate; a step in which the thickness of a substrate is thinned from the second surface side of the substrate opposite to the first surface to form the thinned substrate having a third surface opposite to the first surface; a step in which a groove is formed on the third surface side and in the thinned substrate; a step for providing a resin layer on a part of the third surface and the groove; and a step for dividing the substrate. The width of a groove which is formed in the step for forming the groove is larger than that of a cutting trace when the substrate is divided. There may be a process where a step that the substrate is thinned is omitted.

In either of the step for providing the groove and the step for dividing the substrate (hereinafter, abbreviated as a dividing step), a dicer, a scriber, or the like can be used as a cutting tool. A dicer is preferably used. In a step for providing a groove with a dicer and a step for dividing elements, a dicing blade is used. The edge of the dicing blade used in the step for providing a groove is thinner than that of the dicing blade used in the step for dividing elements. In other words, when cutting traces are compared, the cutting trace in the step for providing a groove is wider than that of the step for dividing elements. The meaning of a cutting trace here is the width of the groove in the case of the step for providing a groove, and is the width of the region where a substrate member is lost between elements before and after dividing elements in the case of the step for dividing when the substrate is fixed.

In a step for polishing the substrate to reduce the thickness, a glass polishing machine, a glass grinding machine, or the like is used in a suitable combination. Wearing out of a dicing blade can be reduced by this polishing step. In addition, by providing the resin layer generation of a crack in the completed element can be suppressed, when a thin substrate is handled and divided. Moreover, a scratch and a crack in the case where elements hit each other in handling elements after division can be reduced, and yield in a visual examination of the elements can be increased. Furthermore, since the thickness of the substrate after division is small, the size of the device on which a semiconductor device of the present invention is mounted can be reduced.

Since the cutting trace in the step for providing a groove is wider than that of the step for dividing elements, the resin layer can be left on an end surface of the element when the element is divided in the step for dividing elements. In other words, the resin is formed in a region of the side surface of the substrate where a groove is formed in a step for providing a groove. On the other hand, on the first surface and the region where substrate is touched to a dicing blade when the dicing blade is used in the dividing step are not covered with the resin layer.

With the present invention, a surface opposite to the surface on which an element is formed and a region of an end surface of the substrate are covered with a resin, whereby generation of a scratch and a crack can be reduced and yield of the element can be increased.

In addition, according to the present invention, wearing out of a cutting tool when a substrate is divided and processed can be reduced by thinning the substrate before the substrate is divided. Thus, a semiconductor device can be manufactured at low cost.

Further, according to the present invention, the thickness of the substrate after the substrate are divided and processed can be reduced. Thus, the size of a semiconductor device provided with an element which is manufactured by the present invention can be reduced.

BRIEF DESCRIPTION OF THE DRAWINGS

The patent or application file contains at least one drawing executed in color. Copies of this patent or patent application publication with the color drawing will be provided by the Office upon request and payment of the necessary fee.

DETAILED DESCRIPTION OF THE INVENTION

Embodiment Mode

Figure 1A:
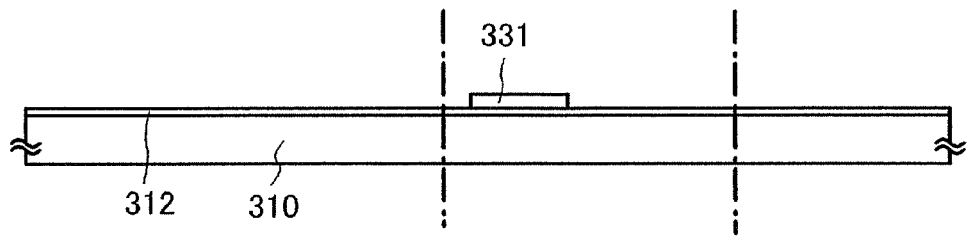
FIGS. 1A to 1D each illustrate a manufacturing step of a semiconductor device of the present invention.

Embodiment modes of the invention will be described below with reference to the drawings. However, the present invention may be embodied in a lot of different forms, and it is to be easily understood that various changes and modifications will be apparent to those skilled in the art unless such changes and modifications depart from the scope of the present invention. Therefore, the present invention is not to be construed with limitation to what is described in the embodiment modes. Note that in the drawings for illustrating the embodiment modes, common portions or potions having similar functions may be denoted by the same reference numerals, and repeated description thereof is omitted.

Embodiment Mode 1

In this embodiment mode, a method for dividing a substrate provided with a semiconductor element is described with reference to FIGS. 1A to 1D, FIGS. 2A to 2C, FIGS. 3A and 3B, FIGS. 4A and 4B, FIGS. 5A to 5D, and FIGS. 6A to 6C. As the semiconductor element, an example of a substrate provided with a photoelectric conversion circuit is described here.

A method for forming a photoelectric conversion element and a field effect transistor over a substrate as semiconductor elements to be divided is described with reference to FIGS. 1A to 1D, FIGS. 2A to 2C, and FIGS. 3A and 3B, which are cross-sectional views of an element. In FIG. 1A, AN100 (made by Asahi Glass Co., Ltd) which is one of the glass substrates is used as a substrate 310. A thin film transistor is used as a field effect transistor formed over a substrate. Over the substrate, a photoelectric conversion element and a thin film transistor can be formed in the same step. Therefore, there is an advantage in that photoelectric conversion devices are easily mass produced. Further, the glass substrate has a light transmitting property, which is effective for a photoelectric conversion element which detects light from top and bottom sides of the substrate. A silicon wafer or the like may be used as appropriate according to application of the element such as an element which detects light from top side of the substrate.

First, a silicon oxide film containing nitrogen (with a film thickness of 100 nm) to be a base insulating film 312 is formed by a plasma CVD method, and a semiconductor film such as an amorphous silicon film containing hydrogen (with a film thickness of 54 nm) is stacked thereover without being exposed to atmospheric air. In addition, the base insulating film 312 may be formed by stacking a silicon oxide film, a silicon nitride film, and a silicon oxide film containing nitrogen. For example, films in which a silicon nitride film containing oxygen with a film thickness of 50 nm and a silicon oxide film containing nitrogen with a film thickness of 100 nm are stacked may be formed as the base insulating film 312. Note that the silicon oxide film containing nitrogen and the silicon nitride film serve as a blocking layer that prevents an impurity such as an alkali metal or the like from diffusing from the glass substrate.

Then, the amorphous silicon film is crystallized by a know technique (a solid-phase growth method, a laser crystallization method, a crystallization method using a catalytic metal, or the like) to form a semiconductor film having a crystalline structure (a crystalline semiconductor film), for example, a polycrystalline silicon film. Here, a polycrystalline silicon film is obtained by a crystallization method using a catalytic element. A nickel acetate solution containing nickel of 10 ppm by weight is added by a spinner. Note that a nickel element may be dispersed over the entire surface by a sputtering method instead of a method adding the solution. Then, heat treatment is performed for crystallization to form a semiconductor film (here, polycrystalline silicon) having a crystalline structure. Here, a polycrystalline silicon film is obtained by heat treatment for crystallization (at 550° C. for four hours) after the heat treatment (at 500° C. for one hour).

Next, an oxide film over the surface of the polycrystalline silicon film is removed by a dilute hydrofluoric acid or the like. After that, in order to increase a crystallization rate and repair defects left in crystal grains, irradiation with laser light (XeCl: wavelength of 308 nm) is performed in the atmosphere or the oxygen atmosphere.

As the laser light, excimer laser light with a wavelength of 400 nm or less; or a second harmonic or a third harmonic of a YAG laser is used. Here, pulsed laser light with a repetition rate of approximately 10 to 1000 Hz is used, the pulsed laser light is condensed to 100 to 500 mJ/cm$^2$ by an optical system, and irradiation is performed with an overlap rate of 90 to 95%, whereby the surface of the polycrystalline silicon film may be scanned. In this embodiment mode, irradiation with laser light having a repetition rate of 30 Hz and energy density of 470 mJ/cm$^2$ is performed in the atmosphere.

Note that since laser light irradiation is performed in an atmospheric air or in an oxygen atmosphere, an oxide film is formed over the surface by the laser light irradiation. Note that although an example in which the pulsed laser is used is shown in this embodiment mode, a continuous wave laser may be used instead. In order to obtain crystal with large grain size at the time of crystallization of a semiconductor film, it is preferable to use a solid laser which is capable of continuous oscillation and to apply the second to fourth harmonic of a fundamental wave. Typically, as laser light of continuous wave laser, a second harmonic (532 nm) or a third harmonic (355 nm) of an Nd:YVO$_4$ laser (a fundamental wave of 1064 nm) may be applied.

In the case of using a continuous wave laser, laser light which is emitted from a continuous wave YVO$_4$ laser of 10 W output is converted into a harmonic by a non-linear optical element. Alternatively, there is a method by which YVO$_4$ crystal and a non-linear optical element are put in a resonator and a high harmonic is emitted. Then, the laser light having a rectangular shape or an elliptical shape on an irradiated surface is preferably formed by an optical system to be emitted to an object to be processed. At this time, a power density of approximately 0.01 to 100 MW/cm$^2$ (preferably, 0.1 to 10 MW/cm$^2$) is necessary. Then, the semiconductor film may be moved at a rate of approximately 10 to 2000 cm/s relatively to the laser light so as to be irradiated.

Subsequently, in addition to the oxide film which is formed by the above laser light irradiation, a barrier layer formed of an oxide film having a thickness of 1 to 5 nm in total is formed by treatment to the surface with ozone water for 120 seconds. The barrier layer is formed in order to remove the catalytic element which is added for crystallization, for example, nickel (Ni), from the film. Although the barrier layer is formed using ozone water here, the barrier layer may be formed by deposition of an oxide film having a thickness of approximately 1 to 10 nm by a method of oxidizing a surface of the semiconductor film having a crystalline structure by UV-ray irradiation in an oxygen atmosphere; a method of oxidizing a surface of the semiconductor film having a crystalline structure by oxygen plasma treatment; a plasma CVD method; a sputtering method; an evaporation method; or the like. Note that the oxide film formed by the laser light irradiation may be removed before formation of the barrier layer.

Then, an amorphous silicon film containing an argon element which serves as a gettering site is formed to be 10 to 400 nm thick, here 100 nm thick, over the barrier layer by a sputtering method. Here, the amorphous silicon film containing an argon element is formed under an atmosphere containing argon with the use of a silicon target. In a case where an amorphous silicon film containing an argon element is formed by a plasma CVD method, deposition conditions are as follows: a flow ratio of monosilane to argon (SiH$_4$:Ar) is 1:99, deposition pressure is set to be 6.665 Pa, RF power density is set to be 0.087 W/cm$^2$, and deposition temperature is set to be 350° C.

After that, heat treatment in a furnace heated at 650° C. is performed for 3 minutes to remove a catalytic element (gettering). Accordingly, the concentration of the catalytic element in the semiconductor film having a crystalline structure is reduced. A lamp annealing apparatus may be used instead of the furnace.

Next, the amorphous silicon film containing an argon element, which is a gettering site, is removed as selected using the barrier layer as an etching stopper, and subsequently, the barrier layer is removed with a diluted hydrofluoric acid as selected. Note that nickel has a tendency to move to a region having high oxygen concentration at the time of gettering; therefore, it is preferable that the barrier layer formed of an oxide film is removed after gettering.

In a case where crystallization to the semiconductor film with the use of a catalytic element is not performed, the above steps such as forming the barrier layer, forming the gettering site, heat treatment for gettering, removing the gettering site, and removing the barrier layer are not necessary.

Next, a thin oxide film is formed on the surface of the obtained semiconductor film having a crystalline structure (for example, a crystalline silicon film) with ozone water, and subsequently, a mask is formed of a resist using a first photomask and the semiconductor film is etched into a desired shape to form an island-shaped semiconductor film (in this specification, referred to as "an island-shaped semiconductor region 331") (see FIG. 1A). After the island-shaped semiconductor region is formed, a mask formed of a resist is removed.

Next, a very small amount of an impurity element (boron or phosphorus) is added in order to control a threshold value of a TFT, if necessary. Here, an ion doping method is used, in which diborane ($B_2H_6$) is not separated by mass but excited by plasma.

Next, the oxide film is removed with an etchant containing a hydrofluoric acid, and at the same time, the surface of the island-shaped semiconductor region 331 is washed. After that, an insulating film containing silicon as its main component, which becomes a gate insulating film 313, is formed. Here, a silicon oxide film containing nitrogen (composition ratio: Si=32%, O=59%, N=7%, and H=2%) is formed to have a thickness of 115 nm by a plasma CVD method.

Figure 1B:
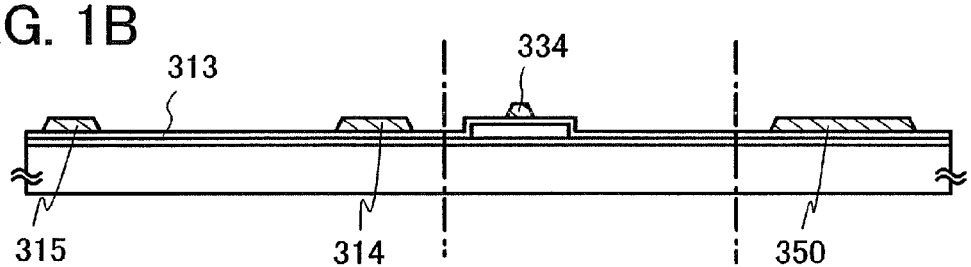

Next, after a metal film is formed over the gate insulating film 313, a second photomask is used to form a gate electrode 334, wirings 314 and 315, and a terminal electrode 350 (see FIG. 1B). As the metal film, for example, a film is used, in which tantalum nitride and tungsten are stacked to be 30 nm and 370 nM respectively.

Next as the gate electrode 334, the wirings 314 and 315, and the terminal electrode 350, instead of the above film, a single-layer film formed from an element selected from titanium (Ti), tungsten (W), tantalum (Ta), molybdenum (Mo), neodymium (Nd), cobalt (Co), zirconium (Zr), zinc (Zn), ruthenium (Ru), rhodium (Rh), palladium (Pd), osmium (Os), iridium (Ir), platinum (Pt), aluminum (Al), gold (Au), silver (Ag), and copper (Cu), or an alloy material or a compound material containing the above element as its main component; a single-layer film formed from nitride thereof, for example, titanium nitride, tungsten nitride, tantalum nitride or molybdenum nitride may be used.

Figure 1C:
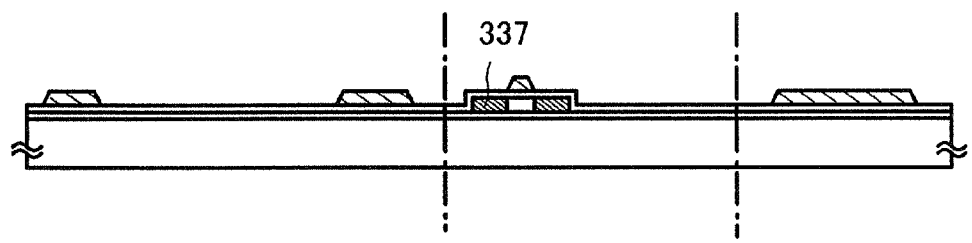

Next, an impurity imparting one conductivity type is introduced into the island-shaped semiconductor region 331 to form a source region and a drain region 337 of a TFT 113 (see FIG. 1C). In this embodiment mode, an n-channel TFT is formed; therefore, an n-type impurity, for example, phosphorus (P) or arsenic (As) is introduced into the island-shaped semiconductor region 331.

Next, a first interlayer insulating film (not shown) including a silicon oxide film is formed to be 50 nm thick by a CVD method, and after that, a step is performed, in which the impurity element added to each of the island-shaped semiconductor regions is activated. This activation process is performed by a rapid thermal annealing method (RTA method) using a lamp light source; an irradiation method with a YAG laser or an excimer laser from the back side; heat treatment using a furnace; or a method which is a combination of any of the foregoing methods.

Then, a second interlayer insulating film 316 including a silicon nitride film containing hydrogen and oxygen is formed, for example, to be 10 nm thick.

Figure 1D:
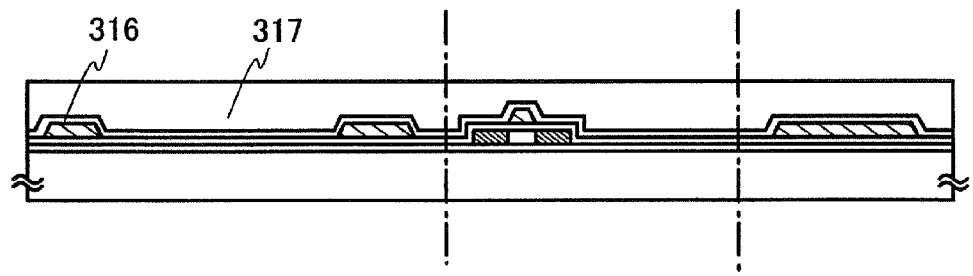

Next, a third interlayer insulating film 317 formed of an insulating material is formed over the second interlayer insulating film 316 (see FIG. 1D). An insulating film obtained by a CVD method can be used for the third interlayer insulating film 317. In this embodiment mode, in order to improve adhesion, a silicon oxide film containing nitrogen is formed to be 900 nm thick as the third interlayer insulating film 317.

Then, heat treatment (heat treatment at 300 to 550° C. for 1 to 12 hours, for example, at 410° C. for 1 hour in a nitrogen atmosphere) is performed to hydrogenate the island-shaped semiconductor film. This step is performed to terminate a dangling bond of the island-shaped semiconductor film by hydrogen contained in the second interlayer insulating film 316. The island-shaped semiconductor film can be hydrogenated regardless of whether or not the gate insulating film 313 is formed.

In addition, as the third interlayer insulating film 317, an insulating film using siloxane and a stacked structure thereof may be used. Siloxane is composed of a skeleton structure of a bond of silicon (Si) and oxygen (O). A compound containing at least hydrogen (such as an alkyl group or an aromatic hydrocarbon) is used as a substituent. Fluorine may be included as a substituent. Alternatively, a compound containing at least hydrogen and fluorine can be used as a substituent.

In a case where an insulating film using siloxane and a stacked structure thereof are used as the third interlayer insulating film 317, after formation of the second interlayer insulating film 316, heat treatment to hydrogenate the island-shaped semiconductor films can be performed, and then, the third interlayer insulating film 317 can be formed.

Next, a mask is formed of a resist using a third photomask, and the first interlayer insulating film, the second interlayer insulating film 316, the third and interlayer insulating film 317, or the gate insulating film 313 are etched to form a contact hole as selected. Then, a mask is formed of a resist is removed.

Note that the third interlayer insulating film 317 may be formed if necessary. In a case where the third interlayer insulating film 317 is not formed, the first interlayer insulating film, the second interlayer insulating film 316, and the gate insulating film 313 are etched as selected after formation of the second interlayer insulating film 316 to form a contact hole.

Next, after formation of a metal stacked film by a sputtering method, a mask is formed of a resist using a fourth photomask, and then, the metal film is etched as selected to form a wiring 319, a connection electrode 320, a terminal electrode 351, a source electrode or a drain electrode 341 of the TFT 113. Then, a mask is formed of a resist is removed. Note that the metal film of this embodiment mode is a stacked-layer film with three films: a Ti film with a thickness of 100 nm, an Al film containing a very small amount of Si with a thickness of 350 nm, and a Ti film with a thickness of 100 nm.

In a case where each of the wiring 319, the connection electrode 320, the terminal electrode 351, and the source electrode or the drain electrode 341 of the TFT 113 is formed of a single-layer conductive film, a titanium film (a Ti film) is preferable in terms of heat resistance, conductivity, and the like. Instead of a titanium film, a single-layer film formed from an element selected from tungsten (W), tantalum (Ta), molybdenum (Mo), neodymium (Nd), cobalt (Co), zirconium (Zr), zinc (Zn), ruthenium (Ru), rhodium (Rh), palladium (Pd), osmium (Os), iridium (Ir) and platinum (Pt), or an alloy material or a compound material containing the above element as its main component; a single-layer film formed from nitride thereof, for example, titanium nitride, tungsten nitride, tantalum nitride, or molybdenum nitride may be used. The number of times of deposition can be reduced in the manufacturing process, by formation of each of the wiring 319, the connection electrode 320, the terminal electrode 351, and the source electrode or the drain electrode 341 of the TFT 113 as a single-layer film.

The top gate TFT 113 using a polycrystalline silicon film can be manufactured through the process described above.

Figure 2A:
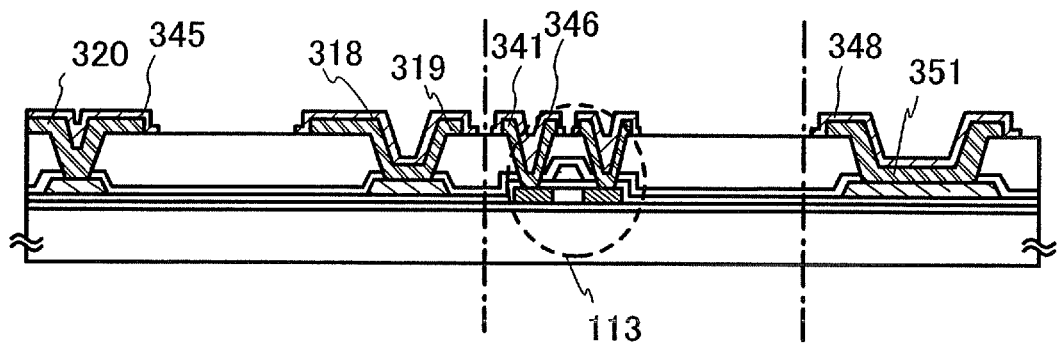
FIGS. 2A to 2C each illustrate a manufacturing step of a semiconductor device of the present invention FIGS. 3A and 3B each illustrate a manufacturing step of a semiconductor device of the present invention.

Subsequently, a conductive metal film (titanium (Ti), molybdenum (Mo), or the like) is formed. A conductive metal film which is not likely to be an alloy due to reaction with a photoelectric conversion layer (typically, amorphous silicon) which is formed later is used for the conductive metal film. Then, a mask formed of resist is formed using the fifth photomask, and a protective electrode 318 which covers the wiring 319, a protective electrode 345, a protective electrode 346, and a protective electrode 348 are formed by etching the conductive metal film selectively (FIG. 2A). Here, a Ti film having a thickness of 200 nm obtained by a sputtering method is used. Note that the connection electrode 320, the terminal electrode 351, and the source electrode or the drain electrode 341 of the TFT 113 are also covered with the conductive metal film. Thus, the conductive metal film also covers a side surface of the substrate where the Al film which is the second layer in these electrodes is exposed; therefore, the conductive metal film can also prevent diffusion of aluminum atoms to the photoelectric conversion layer.

Note that in a case where each of the wiring 319, the connection electrode 320, the terminal electrode 351, and the source electrode or the drain electrode 341 of the TFT 113 are formed as a single-layer conductive film, the protective electrodes 318, 345, 346, and 348 are not necessarily formed.

Next, a photoelectric conversion layer 111 including a p-type semiconductor layer 111*p*, an i-type semiconductor layer 111*i*, and an n-type semiconductor layer 111*n* is formed over the third interlayer insulating film 317.

The p-type semiconductor layer 111*p* may be formed by deposition of a semi-amorphous silicon film (also referred to as a microcrystalline silicon film) containing an impurity element belonging to group 13 of the periodic table such as boron (B) by a plasma CVD method.

As one example of a method for forming a microcrystalline silicon film, a microcrystalline silicon film is formed by glow discharge plasma in mixed gas of silane gas and hydrogen, or silane gas, hydrogen, and rare gas. Silane is diluted with hydrogen, or hydrogen and rare gas by from 10 to 2000 times. Therefore, a large amount of hydrogen, or hydrogen and rare gas is needed. A temperature for heating the substrate is from 100 to 300° C., preferably from 120 to 220° C. It is preferable that deposition be performed at a temperature of 120 to 220° C. in order that a growing surface of the microcrystalline silicon film is inactivated with hydrogen, and growth of microcrystalline silicon is promoted. In the deposition treatment, crystals of a SiH radical, a $SiH_2$ radical, and a $SiH_3$ radical which are active species are grown from the crystal nuclei. Further, an energy band width may be adjusted by mixing germanium hydride or germanium fluoride such as $GeH_4$ or $GeF_4$ into gas such as silane or by adding carbon or germanium to silicon. When carbon is added to silicon, an energy band width becomes wider, and when germanium is added to silicon, an energy band width becomes narrower.

In addition, the wiring 319 and the protective electrode 318 are in contact with the bottom layer of the photoelectric conversion layer 111, in this embodiment mode, the p-type semiconductor layer 111*p*.

After the p-type semiconductor layer 111*p* is formed, the i-type semiconductor layer 111*i* and the n-type semiconductor layer 111*n* are sequentially formed. Accordingly, the photoelectric conversion layer 111 including the p-type semiconductor layer 111*p*, the i-type semiconductor layer 111*i*, and the n-type semiconductor layer 111*n* is formed.

As the i-type semiconductor layer 111*i*, for example, a microcrystalline silicon film may be formed by a plasma CVD method. Note that as the n-type semiconductor layer 111*n*, a microcrystalline silicon film containing an impurity element belonging to Group 15 of the periodic table, for example, phosphorus (P) may be formed, or after formation of a microcrystalline silicon film, an impurity element belonging to Group 15 of the periodic table may be introduced.

As the p-type semiconductor layer 111*p*, the i-type semiconductor layer 111*i*, and the n-type semiconductor layer 111*n*, an amorphous semiconductor film may be used as well as a microcrystalline semiconductor film. Alternatively, a polycrystalline semiconductor film formed by using the above mentioned catalyst or the above mentioned laser crystallization process may be used.

Further, single crystal silicon formed by Smart Cut or microcrystalline silicon may be used.

Figure 2B:
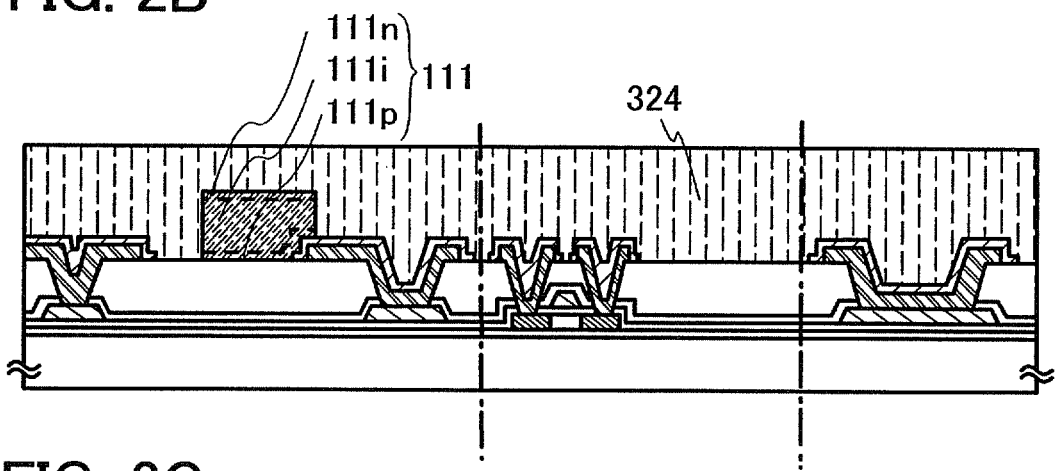
Figure 2C:
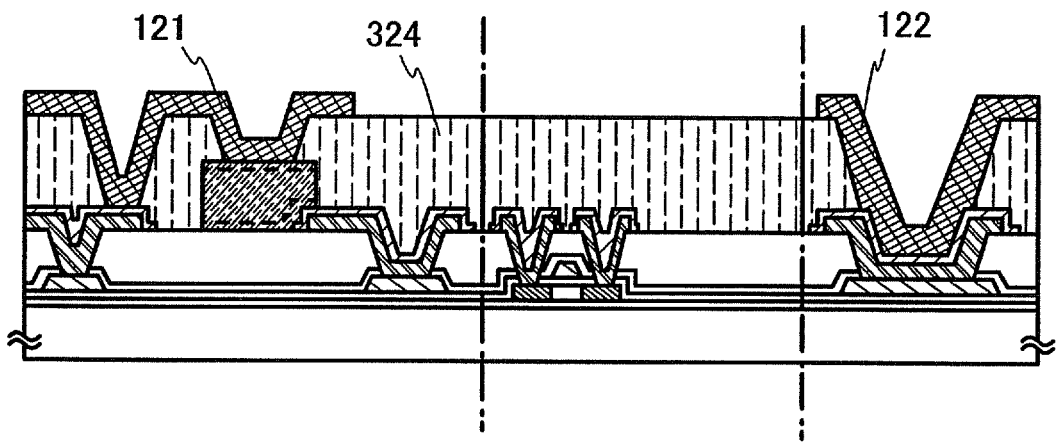

Next, a sealing layer 324 is formed from an insulating material (for example, an inorganic insulating film containing silicon) to have a thickness of 1 to 30 μm over the entire surface to obtain a state shown in FIG. 2B. Here, as an insulating material film, a silicon oxide film containing nitrogen with a thickness of 1 μm is formed by a CVD method. By using insulating film formed by CVD method, improvement in adhesion can be achieved.

Subsequently, after the sealing layer 324 is etched to provide openings, wirings 121 and 122 are formed by a sputtering method. The wirings 121 and 122 are titanium films (a Ti film) (thickness of 200 nm) which are obtained by a sputtering method.

Figure 3A:
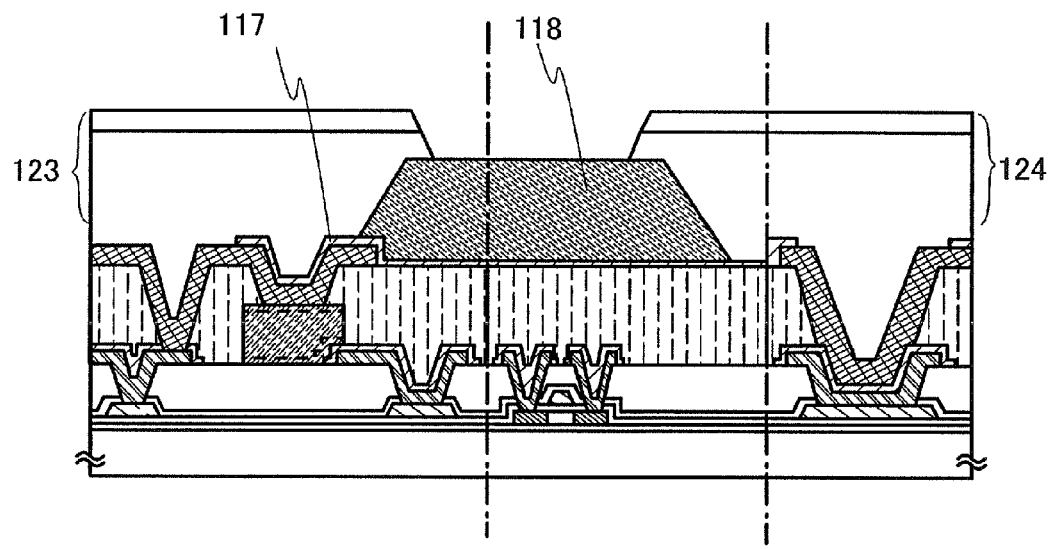

Subsequently, a protective film 117 is formed to cover an exposed surface (see FIG. 3A). As the protective film 117, a silicon nitride film is used in this embodiment mode. The protective film 117 makes it possible to prevent mixing of impurities such as moisture and organic matter into the TFT 113 and the photoelectric conversion layer 111.

Subsequently, a region of the protective film where a terminal electrode of the upper layer is electrically connected to the wiring 121 or the wiring 122 of the lower layer is etched, and a contact hole is formed.

Subsequently, a sealing film 118 is formed over the protective film 117. The sealing film 118 is formed in order to stop proceeding etching when a terminal electrode formed in the upper layer in a later step is processed. The sealing film 118 also functions as a planarizing film. In this embodiment mode, the sealing film 118 is formed to a thickness of 2.5 μm with photosensitive polyimide. Ohmcoat 1012B (made by Namics corporation) which is photosensitive polyimide may be used for the sealing film 118.

Subsequently, stacked layers of a titanium film (a Ti film) (thickness of 100 nm), a nickel film (a Ni film) (thickness of 300 nm), and a gold film (an Au film) (thickness of 50 nm) are formed over the sealing film 118 using nickel (Ni) paste by a sputtering method, for example. The fixing intensity of the terminal electrodes 123 and 124 as thus obtained exceeds 5 N, which is enough fixing intensity as a terminal electrode.

Figure 3B:
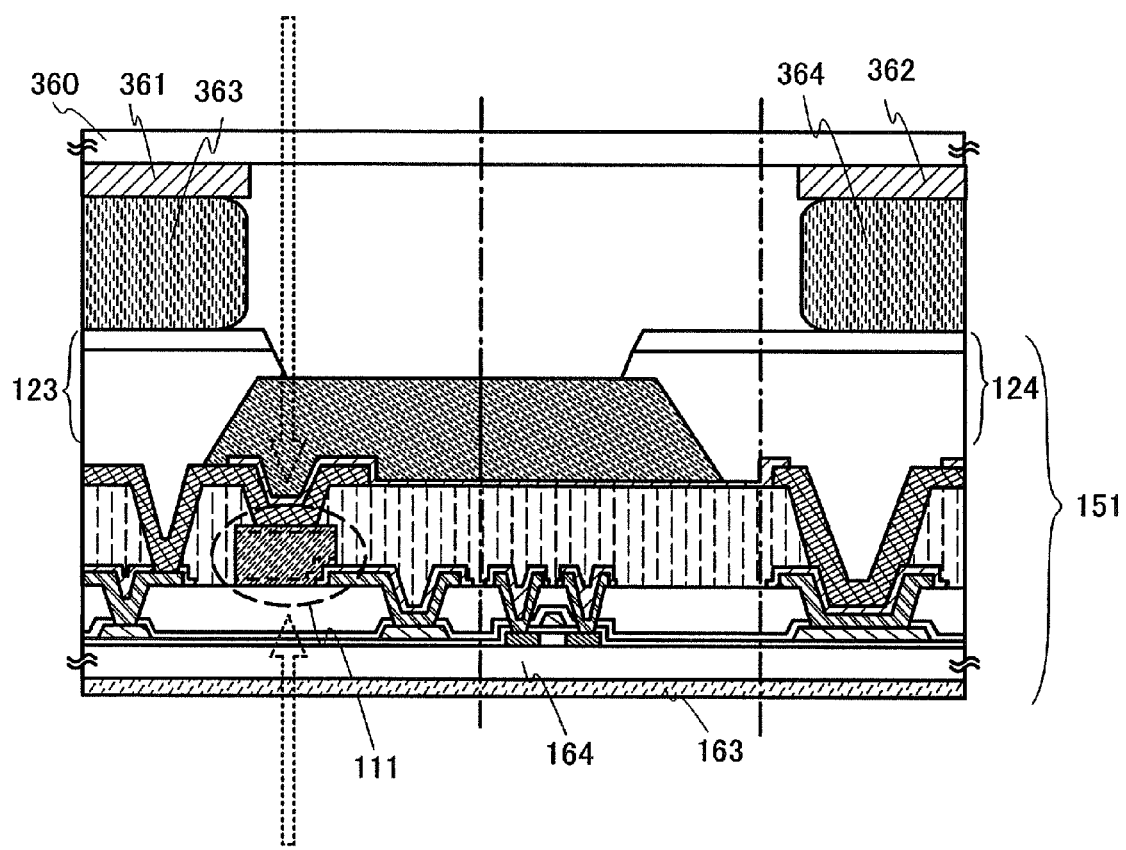

Through the steps described above, the terminal electrodes 123 and 124 which can be connected by a solder are formed, and a structure illustrated in FIG. 3B can be obtained.

Actually, photoelectric conversion circuit elements each of which includes a photoelectric conversion layer, a TFT, and the like, and which are formed at the time of FIG. 3B can be mass produced by forming element materials over a large-sized substrate. A large number of photoelectric conversion circuit elements (e.g, 2 mm×1.5 mm) can be manufactured using one large-size substrate (e.g, 600 cm×720 cm). The state is illustrated in FIGS. 4A and 4B.

Figure 4A:
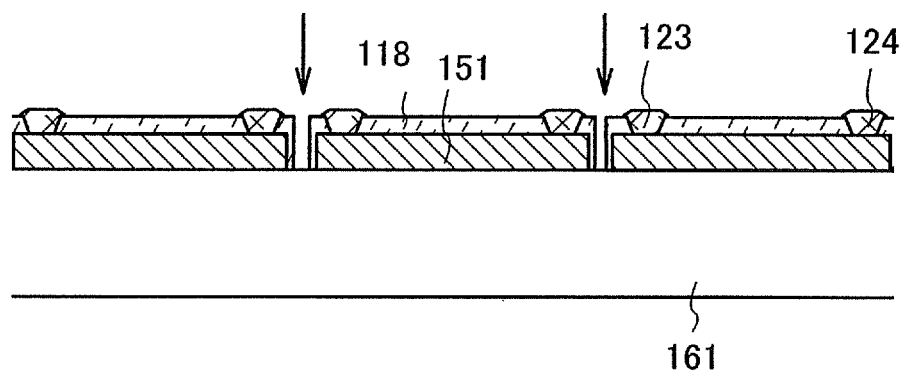
FIGS. 4A and 4B each illustrate a manufacturing step of a semiconductor device of the present invention.

In FIG. 4A, an element layer 151, the sealing film 118, and the terminal electrodes 123 and 124 are formed over a large-sized substrate 161. The element layer 151 includes all structures formed between the large-sized substrate 161 and the sealing film 118 in FIGS. 4A and 4B (see FIG. 3B).

Figure 4B:
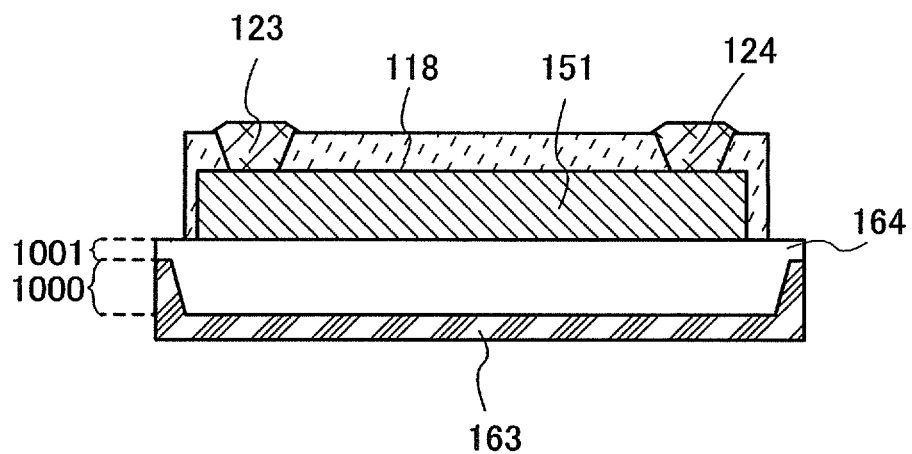

The large-sized substrate 161 is divided between the element layers 151 which are adjacently formed, so that a substrate 164 having an element is formed (see FIG. 4B). Note that, here, the substrate 164 includes a first region which is covered with a resin layer 163 and a second region where the side surface is exposed. In the cross-section of the substrate, the thickness of the upper section of the stepped trapezoidal is a thickness 1000 of the first region, and the lower section of the stepped trapezoidal is a thickness 1001 of the second region.

Figure 5A:
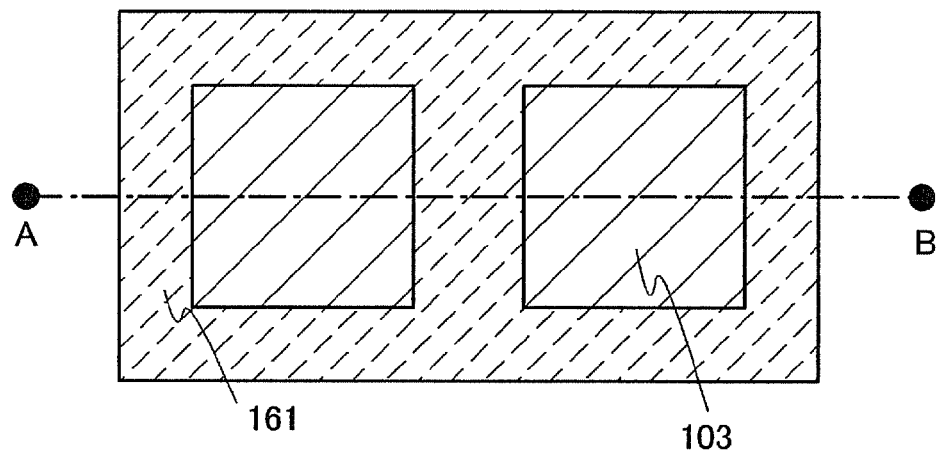
FIGS. 5A to 5D each illustrate a manufacturing step of a semiconductor device of the present invention.
Figure 5B:
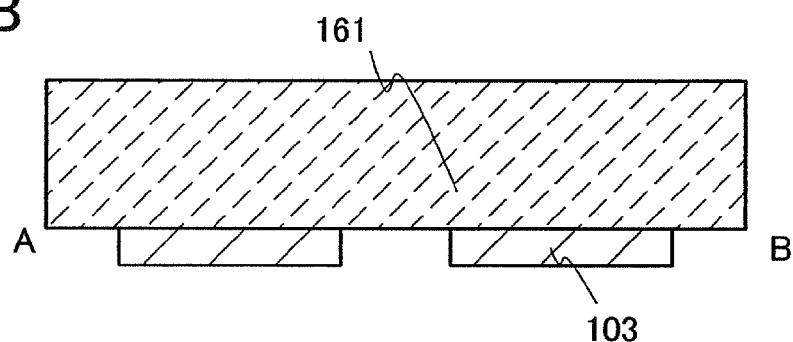

In this manner, FIG. 5A illustrates a top view of the large-sized substrate 161 over which photoelectric conversion elements 103 including a photoelectric conversion layer, a TFT, and the like is formed. A state that two photoelectric conversion elements 103 are formed on the large-sized substrate 161 is illustrated for description here. In FIG. 5A, the size of the photoelectric conversion element 103 (that is, the size of the semiconductor device which is divided) can be approximately 2 mm×1.5 mm, 2 mm×1.2 mm, or 1 mm×1.2 mm.

The step for dividing the substrate is described with reference to FIGS. 5B to 5D, and FIGS. 6A and 6B which are cross-sectional views taken along line A-B. Here, the photoelectric conversion elements 103 are illustrated at the bottom side of the substrate.

Figure 5C:
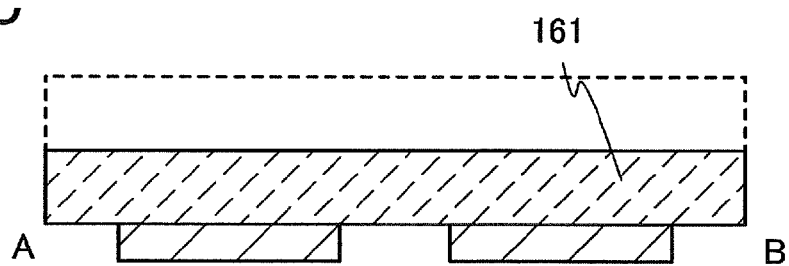

A piece of dicing tape is attached to the surface on which the photoelectric conversion element 103 is formed, and the surface of the large-sized substrate 161 opposite to the surface on which the photoelectric conversion elements 103 are formed is polished using a polishing machine as illustrated in FIG. 5C. This polishing step is performed in order to reduce wearing out of a blade of a dicing blade when the large-sized substrate 161 is divided using a dicer in a later step. Here, the large-sized substrate 161 of 0.5 mm in thickness is polished to a thickness 0.25 mm. A polishing machine and a grinding machine can be used together as a polishing means. In the polishing step, an abrasive cloth with rough texture and an abrasive cloth with smooth texture are used, and it is preferable that two polishing steps are provided.

Figure 5D:
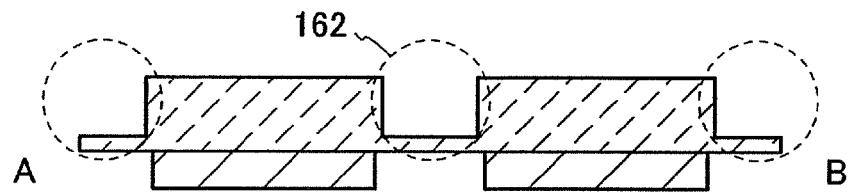

Subsequently, as illustrated in FIG. 5D, the portion where no element is formed on the large-sized substrate 161 is removed to the depth of middle of the large-sized substrate 161 by grinding (also referred to as "halfcut" in this specification), so that a groove 162 is formed.

In this embodiment mode, the depth of the groove 162 is half the depth of the large-sized substrate 161 in the step for forming the groove 162, that is, the step for providing the groove. Specifically, the groove 162 of approximately 0.03 to 0.05 mm in depth is formed by using a dicing blade of 0.16 mm in width.

Figure 6A:
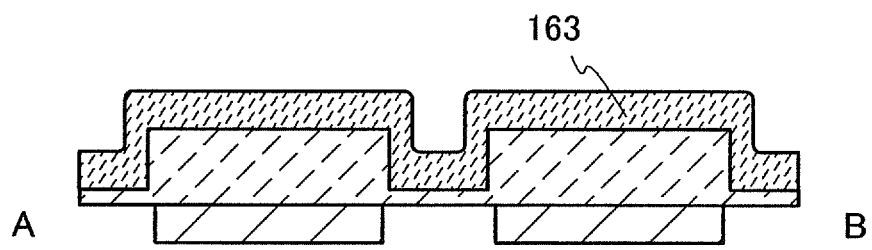
FIGS. 6A to 6C each illustrate a cross-sectional view of a semiconductor device of the present invention.

Then, after the piece of dicing tape is removed, the groove 162 is subjected to a resin coating process using a spinner over the groove 162, and then the resin layer 163 is formed as illustrated in FIG. 6A.

Formation of a resin layer which functions as a shock absorber gives a higher stress resistance property to the semiconductor device. For example, in the semiconductor device provided with a resin layer of the present invention, even when a pressure of approximately 20 N is applied to the semiconductor device, it can be resisted without being damaged.

As a material used for the resin layer, a heat-resistant high-molecular material such as polyimide, aromatic polyamide, or polybenzimidazole, or a siloxane resin may be used. Further, the following resin material may also be used: a vinyl resin such as polyvinyl alcohol or polyvinyl butyral, an epoxy resin, a phenol resin, a novolac resin, an acrylic resin, a melamine resin, an urethane resin, or the like. Acrylic is used as the material here.

The resin layer 163 is formed to a thickness of 100 to 1000 μm (preferably, thickness of 1 μm to 20 μm) in an application condition with which preferable coverage can be achieved. Acrylic is formed to a thickness of 6 μm here.

Figure 6B:
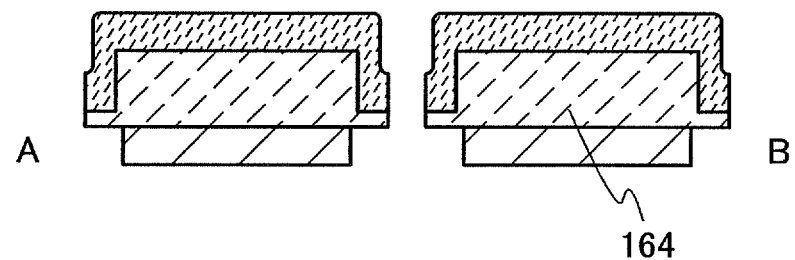

Further, a piece of dicing tape is attached to the resin layer 163, and a dicing blade of 0.1 mm which fits the groove 162 is used to cut the large-sized substrate 161 and the resin layer 163 along the inside of the groove 162 as illustrated in FIG. 6B. This step is referred to as a step for dividing elements. The width of the dicing blade which is used in the step for dividing elements is smaller than that of the dicing blade which is used in the step for forming a groove. Thus, the resin layer 163 can be formed on the end surface portion of the substrate 164 which is provided with the photoelectric conversion element 103. Note that the substrate can be cut using the dicing blade from the surface on which the photoelectric conversion element 103 is formed or from the opposite surface on which the photoelectric conversion element 103 is formed. In this embodiment mode, the substrate is cut from the surface on which the photoelectric conversion element 103 is formed for the reason that a marker provided on the substrate is easy to read and the position of the substrate is easy to check.

Figure 6C:
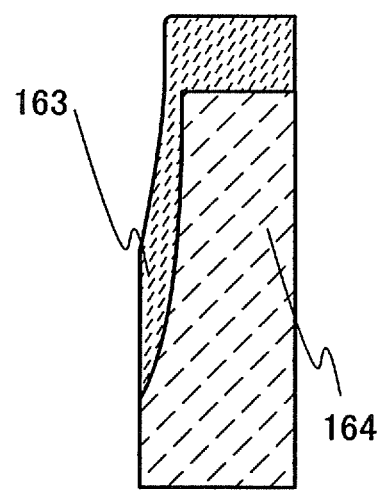

The shapes of the glass substrate and the resin layer are like the shapes as illustrated in FIG. 6C as an example, though they depend on the condition of the resin layer formation. Although a part of the substrate in which the dicing blade is touched to a base material in the dividing step is exposed, the other portion is covered with resin. A corner of the resin layer 163 is rounded.

Figure 15A:
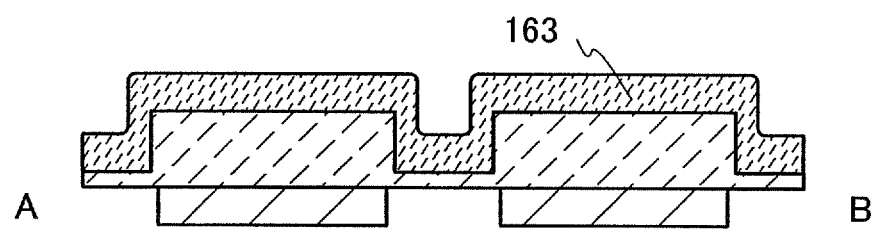
FIGS. 15A to 15C illustrate a manufacturing step of a semiconductor device of the present invention.
Figure 15B:
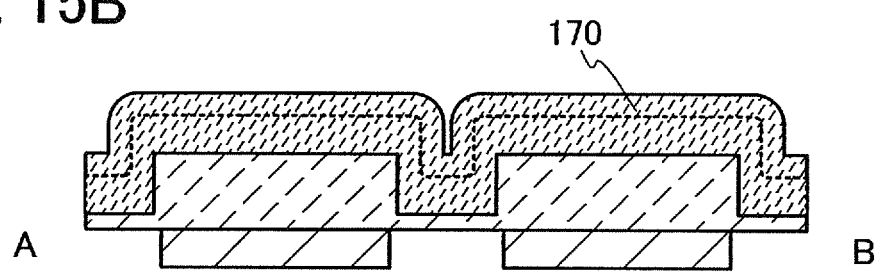
Figure 15C:
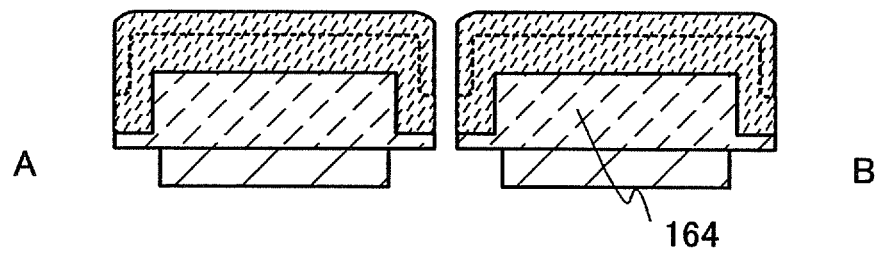

Since the thickness of the substrate is larger than that of the resin layer in order to improve coverage at the end portion of the substrate, a thicker resin layer is preferable. A stacked structure may be employed to form a thick resin layer. FIGS. 15A to 15C illustrate an example in which resin layers are stacked.

FIG. 15A corresponds to FIG. 6A. In the large-sized substrate 161, the resin layer 163 is formed over a surface opposite to the surface on which the photoelectric conversion element 103 is formed. Subsequently, a resin layer which is a resin layer 170 is further formed over the resin layer 163. In this embodiment mode, a resin layer of the same material as the resin layer 163 are stacked (see FIG. 15B). Similar to FIGS. 6A to 6C, the resin layer 170 which is fixed with a piece of dicing tape and the large-sized substrate 161 are divided using a dicing blade. Then, the substrate 164 provided with a resin layer on the end surface and the photoelectric conversion element 103 is formed (see FIG. 15C). In the semiconductor device in FIG. 15C formed through the above described process, the resin layer is formed thicker than that illustrated in FIGS. 6A to 6C, so that the end portion of the substrate 164 is aligned with the end portion of the resin layer.

A stack of resin layers which functions as a shock absorber gives a higher stress resistance property to the semiconductor integrated circuit.

In the present invention, since a groove is formed, and a resin layer is formed over the groove, a thick resin layer can be formed over the bottom surface of the groove. Further, after the formation of the resin layer, the resin layer is stacked over the substrate and they are cut, so that the end portion of the resin layer is aligned with the end portion of the substrate on the side surface of the semiconductor device. The end portion of the upper part of the substrate is not exposed on the side surface of the semiconductor device, so that damage and a chip of the end portion of the substrate can be prevented. Further, when the resin layer is formed thick with stacked layers, the damage to the end portion of the substrate can be reduced because the distance between the end portion of the substrate and the end portion of the resin layer can be long on the side surface of the semiconductor device.

In this way, the substrate 164 provided with the photoelectric conversion element 103 is mounted on the substrate 360 at the terminal electrodes 123 and 124 with solders 363 and 364 (see FIG. 3B). Note that an electrode 361 on the substrate 360 is mounted on the terminal electrode 123 with the solder 363. Further, the electrode 362 on the substrate 360 is mounted on the terminal electrode 124 with the solder 364.

In the photoelectric conversion element illustrated in FIG. 3B, light which enters the photoelectric conversion layer 111 can pass through both of the substrate 164 side and the substrate 360 side which have the light-transmitting property.

In the semiconductor device, in order that the resin layer is not exposed to the photoelectric conversion element side, the semiconductor device is possible to have heat resistance to the heat treatment which is performed to mount the photoelectric conversion element using a solder and an anisotropic conductive film.

If the resin layer 163 includes pigment, the completed photoelectric conversion element can be used as a color sensor. For example, in the case where the resin layer is blue, a color sensor responds to blue. Further, if the thickness of the substrate in contact with the resin layer is small, the percentage of light which passes through the side surface of the substrate or is absorbed in the substrate with respect to the light which enters the surface of the substrate can be reduced. Therefore, the angle at which light can be received can be broadened.

A photoelectric conversion element is formed through the above described manufacturing method, and thus a photoelectric conversion element can be formed with low unit cost and with high yield. Note that a photoelectric conversion element is given as an example of an element. The feature of the present invention is the cutting method of an element, and can be applied to any element as long as the element is formed by bring divided the substrate.

Embodiment Mode 2

Various types of field effect transistors can be employed as the n-channel transistor and the p-channel transistor described in Embodiment Mode 1. Therefore, there is no limitation to the kinds of transistors to be used. For example, a thin film transistor (a TFT) including a film of non-single crystalline semiconductor typified by amorphous silicon, polycrystalline silicon, microcrystalline silicon, or the like can be employed. In the case of using the TFT, there are various advantages. For example, since the TFT can be formed at a temperature lower than that of the case of using single crystalline silicon, manufacturing cost can be reduced and a manufacturing apparatus can be made larger. Since the manufacturing apparatus can be made larger, the TFT can be formed using a large-sized substrate. Therefore, since many photoelectric conversion devices can be formed at the same time, the TFT can be formed at low cost. In addition, a substrate having low heat resistance can be used because of low manufacturing temperature. Therefore, the transistor can be formed over a light-transmitting substrate. Further, transmission of light in a photoelectric conversion element can be controlled by using the transistor formed over the light-transmitting substrate.

Note that by using a catalyst (e.g., nickel) as described in Embodiment Mode 1 in the case of forming polycrystalline silicon, crystallinity can be further improved, and a transistor having excellent electric characteristics can be formed. As a result, a circuit which is required to operate at a high speed can be formed over the one substrate. Note that by using a catalyst (e.g., nickel) in the case of forming microcrystalline silicon, crystallinity can be further improved and a transistor having excellent electric characteristics can be formed. At this time, crystallinity can be improved by performing heat treatment without laser irradiation. In the case of not using a laser for crystallization, crystallinity unevenness of silicon can be suppressed. Therefore, variation in characteristics among transistors can be reduced. Note that polycrystalline silicon and microcrystalline silicon can be formed without using a catalyst (e.g., nickel).

Alternatively, transistors can be formed by using a semiconductor substrate, an SOI substrate, or the like. Therefore, transistors with small variations in characteristics, size, shape, or the like, with high current supply capability, and with a small size can be formed. By using such transistors, power consumption of a circuit can be reduced or a circuit can be highly integrated.

Alternatively, a transistor including a compound semiconductor or an oxide semiconductor such as zinc oxide, silicon germanium, gallium arsenide, tin oxide, IZO (indium zinc oxide), ITO (indium tin oxide), or a-InGaZnO, and a thin film transistor or the like obtained by thinning such a compound semiconductor or an oxide semiconductor can be used. Therefore, manufacturing temperature can be lowered and for example, a transistor can be formed at room temperature. Accordingly, the transistor can be formed directly on a substrate having low heat resistance such as a plastic substrate or a film substrate.

Alternatively, a transistor or the like formed by using an inkjet method or a printing method can also be used. Accordingly, a transistor can be formed at room temperature, can be formed at a low vacuum, or can be formed using a large-sized substrate. Since the transistor can be formed without using a mask (a reticle), layout of the transistor can be easily changed. Further, since it is not necessary to use a resist, material cost is reduced and the number of steps can be reduced. Furthermore, since a film is formed only in a necessary portion of the substrate, a material is not wasted compared with a manufacturing method in which etching is performed after the film is formed over the entire surface, so that cost can be reduced.

Alternatively, a transistor including an organic semiconductor or a carbon nanotube, or the like can be used. Accordingly, such a transistor can be formed using a substrate which can be bent. Therefore, such transistors can resist a shock.

Various types of field effect transistors can be used and be formed using various types of substrates. Accordingly, all of the circuits which are necessary to realize a given function can be formed over the same substrate. For example, all of the circuits which are necessary to realize a given function can be formed over a glass substrate, a plastic substrate, a single crystalline substrate, an SOI substrate, or any of the other substrates. Note that the photoelectric conversion device of this embodiment mode can be formed over a light-transmitting substrate such as a glass substrate by forming a field effect transistor using a thin film transistor. Therefore, when the photoelectric conversion element is formed over the substrate, not only the light from top surface side but also the light transmitted through the substrate from the rear side of the substrate can be received by the photoelectric conversion element, whereby it is effective to enhance the efficiency of light reception.

Note that this embodiment mode can be implemented by being combined with any technical elements in other embodiment modes of this specification.

Embodiment Mode 3

Figure 7:
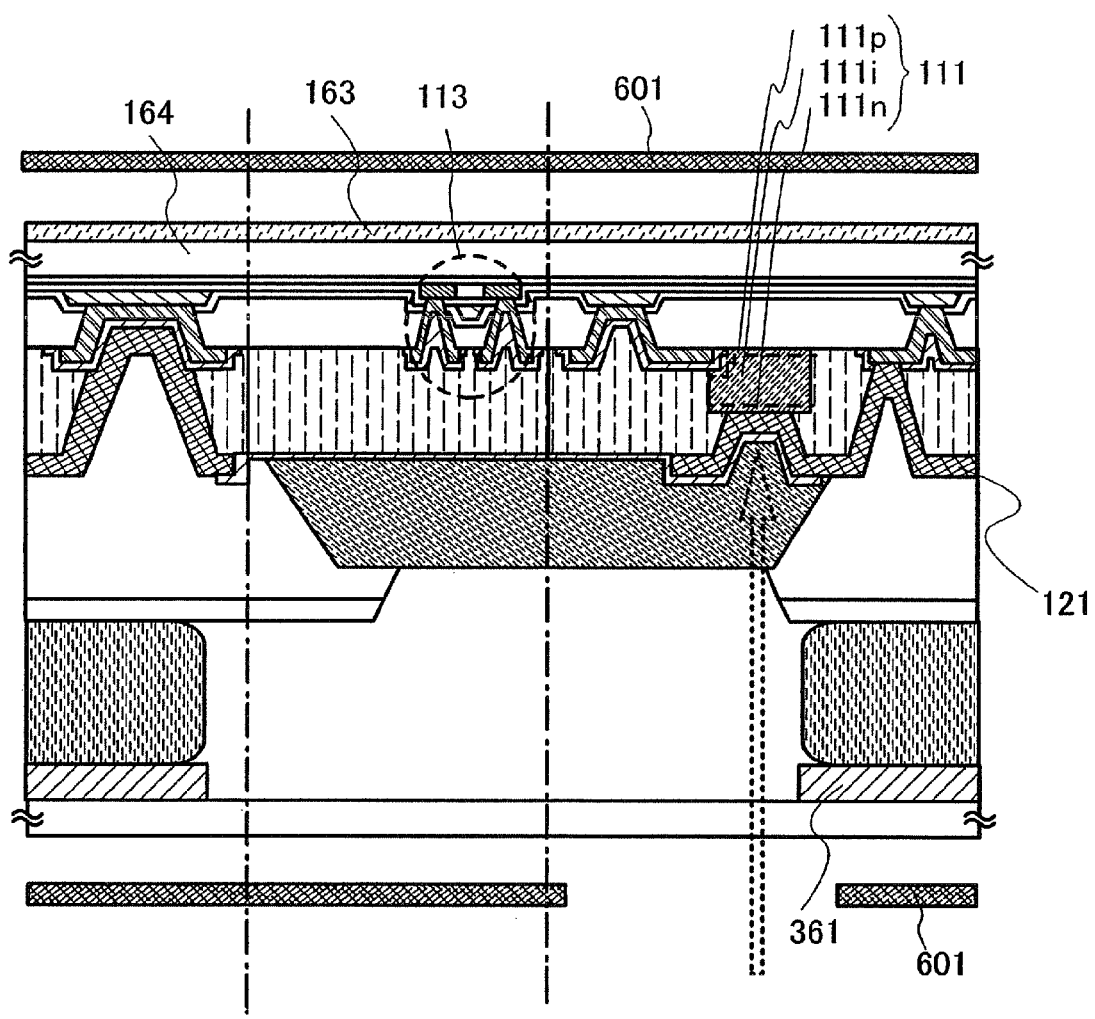
FIG. 7 illustrates a cross-sectional view of a semiconductor device of the present invention.
Figure 8:
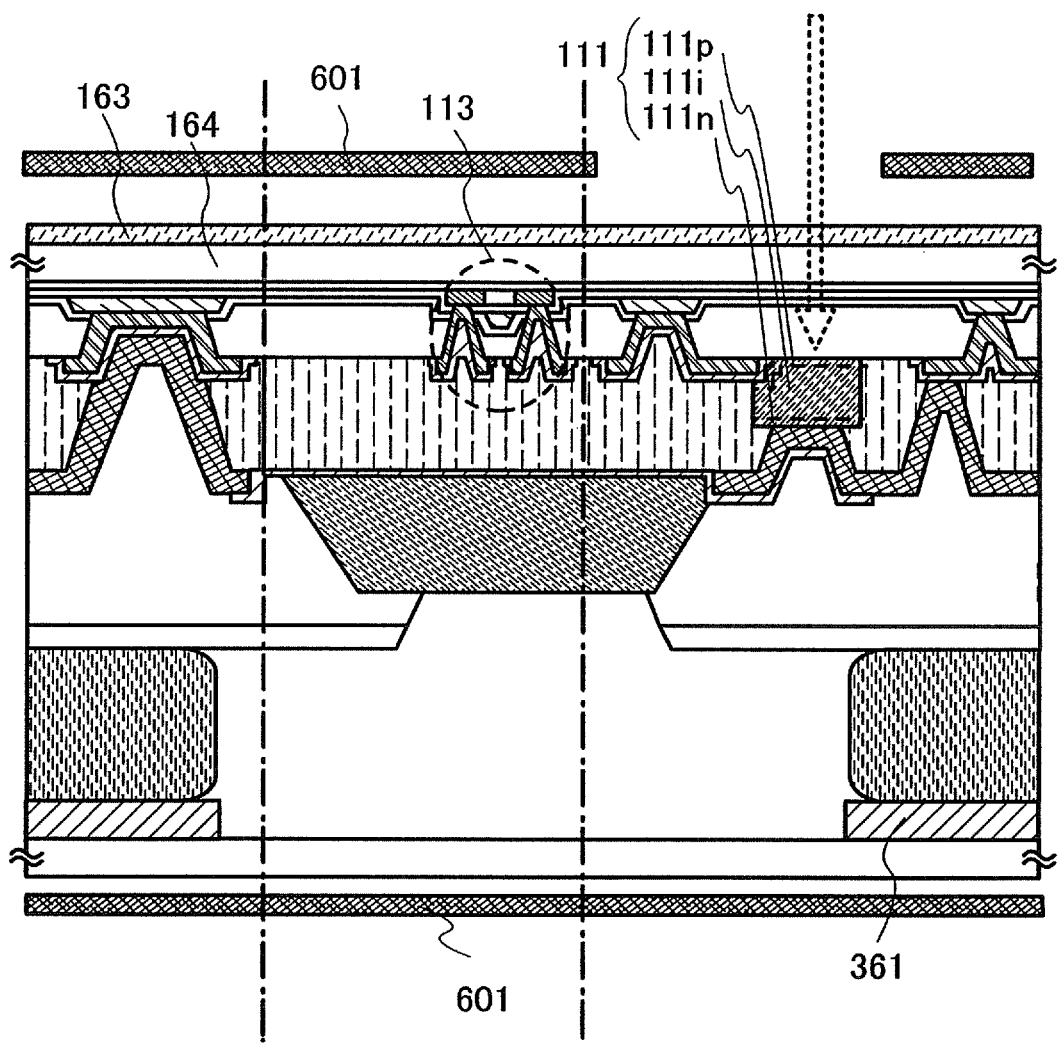
FIG. 8 illustrates a cross-sectional view of a semiconductor device of the present invention.

This embodiment mode will describe an example in which a photoelectric conversion device of the present invention is provided in a housing to control the incident direction of light, with reference to FIGS. 7 and 8.

FIG. 7 illustrates that after the electrodes 361 and 362 over the substrate 360 are mounted on the terminal electrodes 123 and 124 with the solders 363 and 364 interposed therebetween in the photoelectric conversion device illustrated in FIG. 3B, a housing 601 is formed so that light enters the photoelectric conversion layer 111 not from the substrate 164 side but from only the substrate 360 side. The housing 601 is provided with an opening in a region where the photoelectric conversion layer 111 is formed so that light can enter the region where the photoelectric conversion layer 111.

Although there is the wiring 121 in FIG. 7, the incident light from the substrate 360 side enters the photoelectric conversion layer 111 obliquely through the sealing layer 324, so that the photocurrent is generated and light can be detected.

Any material may be used for the housing 601 as long as the material has a function of blocking light. For example, a metal material, a resin material including black pigment, or the like may be used for formation of the housing.

FIG. 8 illustrates that after the electrodes 361 and 362 over the substrate 360 are mounted on the terminal electrodes 123 and 124 with the solders 363 and 364 interposed therebetween in the photoelectric conversion device illustrated in FIG. 3B, the housing 601 is formed so that light enters the photoelectric conversion layer 111 not from the substrate 360 side but from only the substrate 164 side. The housing 601 is provided with an opening in a region where the photoelectric conversion layer 111 on the substrate 164 side is formed so that light can enter the region where the photoelectric conversion layer 111.

In FIG. 8, the incident light from the substrate 164 side enters the photoelectric conversion layer 111 obliquely through the resin layer 163 which has a light-transmitting property, so that the photocurrent is generated and light can be detected.

Note that this embodiment mode can be implemented in combination with any of technical elements of the other embodiment modes in this specification.

Embodiment Mode 4

In this embodiment mode, an example in which a photoelectric conversion device obtained by the present invention is incorporated in various electronic devices is described. Electronic devices to which the present invention is applied include a computer, a display, a mobile phone, a TV set, and the like. Specific examples of those electronic devices are illustrated in FIG. 9, FIGS. 10A and 10B, FIGS. 11A and 11B, FIG. 12, and FIGS. 13A and 13B.

Figure 9:
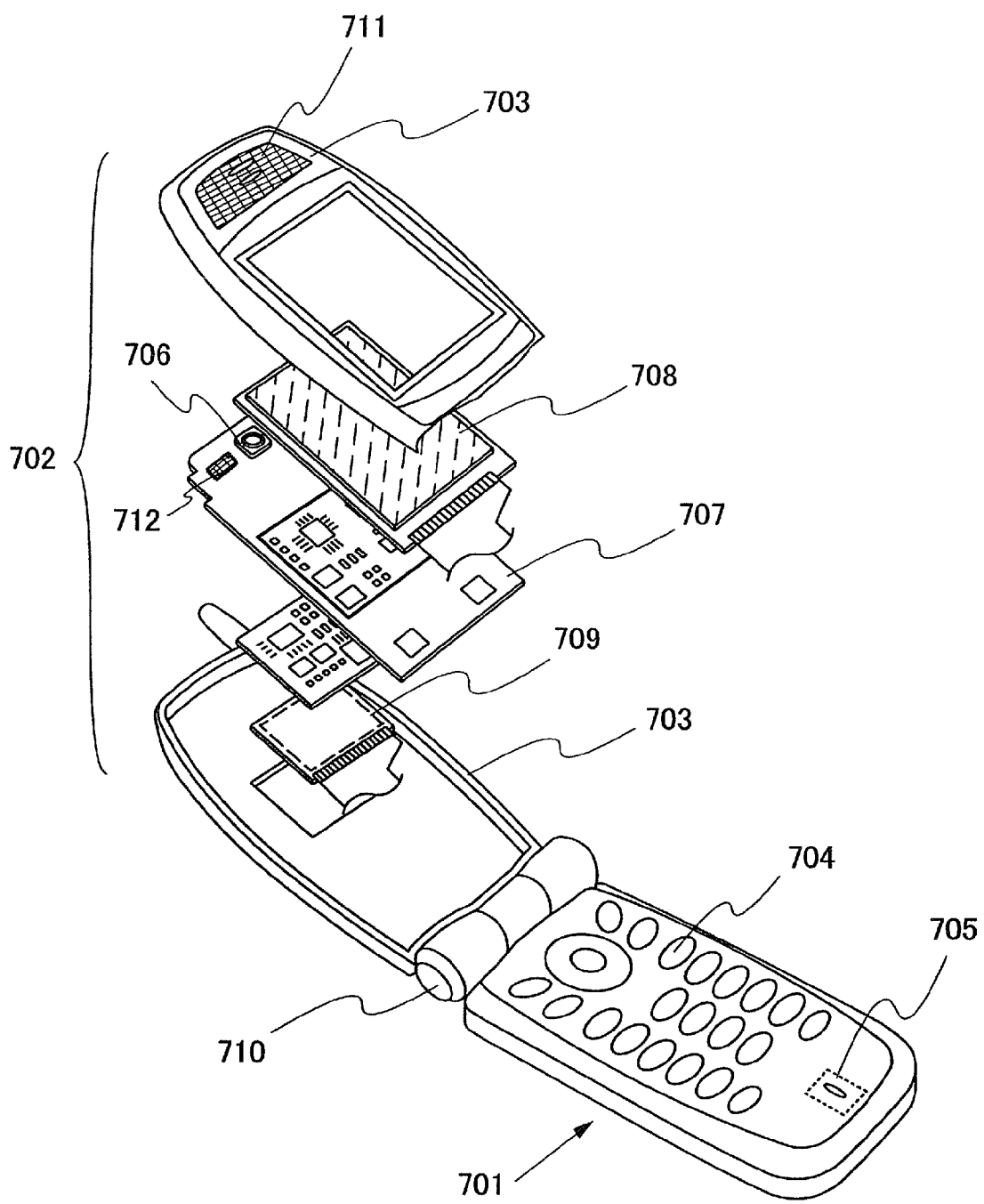
FIG. 9 illustrates a device on which a semiconductor device of the present invention is mounted.

FIG. 9 illustrates a mobile phone and includes a main body (A) 701, a main body (B) 702, a housing 703, operation keys 704, an audio output portion 705, an audio input portion 706, a circuit substrate 707, a display panel (A) 708, a display panel (B) 709, a hinge 710, a light-transmitting material portion 711, and a photoelectric conversion device 712. The present invention can be applied to the photoelectric conversion device 712.

The photoelectric conversion device 712 detects the light which is transmitted through the light-transmitting material portion 711, and the luminance of the display panel (A) 708, the display panel (B) 709 is controlled based on the illuminance of external light that is detected, or illumination of the operation keys 704 is controlled based on the illuminance obtained by the photoelectric conversion device 712. Accordingly, current consumption of the mobile phone can be reduced.

Figure 10A:
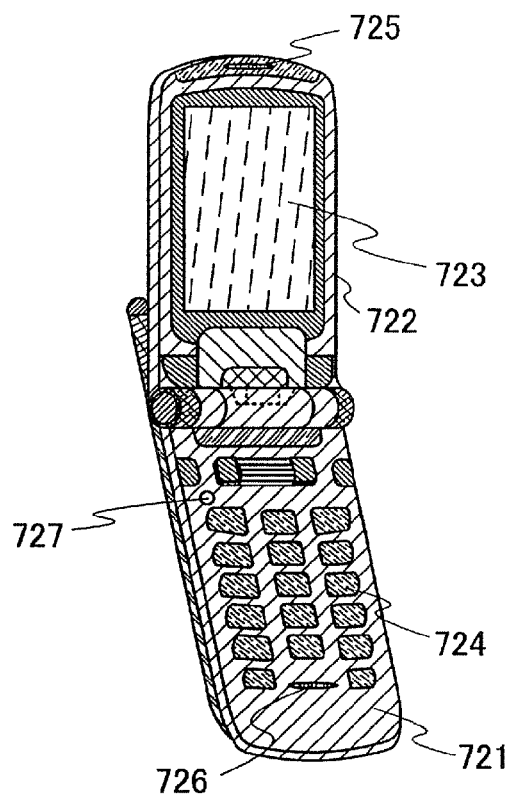
FIGS. 10A and 10B illustrate a device on which a semiconductor device of the present invention is mounted.
Figure 10B:
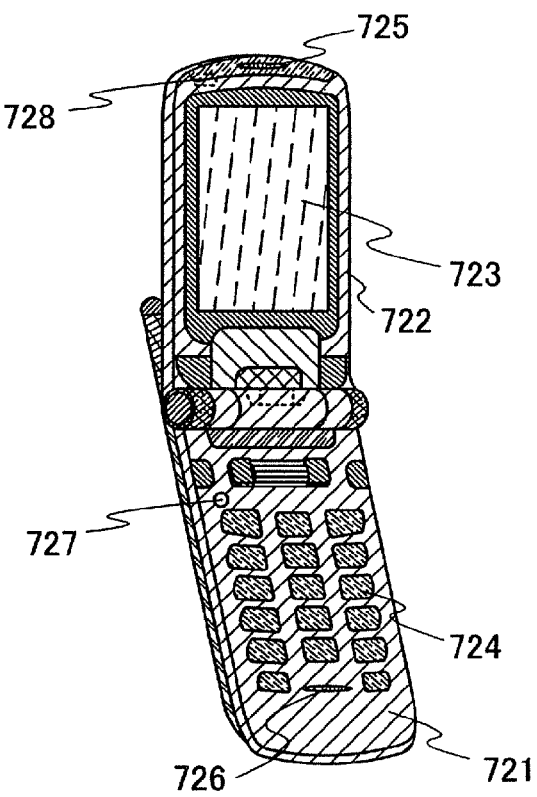

FIGS. 10A and 10B illustrate another example of a mobile phone. In FIGS. 10A and 10B, reference numeral 721 denotes a main body, 722 denotes a housing, 723 denotes a display panel, 724 denotes operation keys, 725 denotes an audio output portion, 726 denotes an audio input portion, 727 denotes a photoelectric conversion device, and 728 denotes a photoelectric conversion device.

In the mobile phone illustrated in FIG. 10A, the luminance of the display panel 723 and the operation keys 724 can be controlled by detecting the light from the exterior with the photoelectric conversion device 727 which is provided in the main body 721.

In the mobile phone illustrated in FIG. 10B, the photoelectric conversion device 728 is provided inside the main body 721 in addition to the structure of FIG. 10A. By the photoelectric conversion device 728, the luminance of the backlight which is provided in the display panel 723 also can be detected.

Figure 11A:
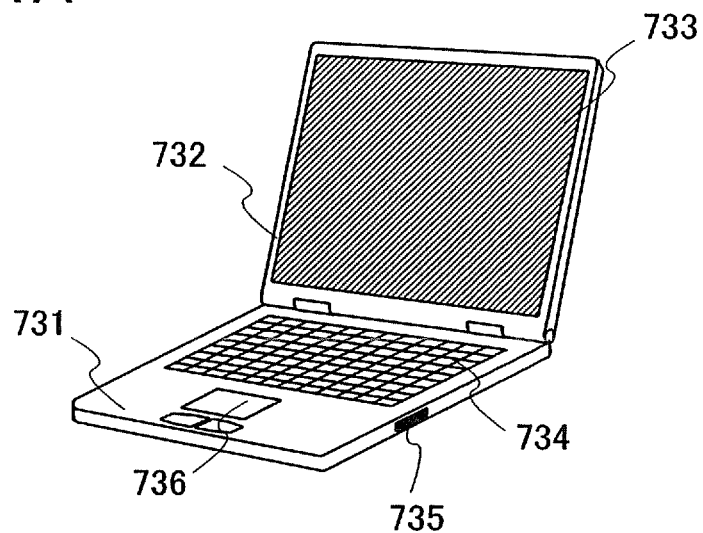
FIGS. 11A and 11B illustrate devices on which a semiconductor device of the present invention is mounted.

FIG. 11A illustrates a computer including a main body 731, a housing 732, a display portion 733, a keyboard 734, an external connection port 735, a pointing device 736, and the like.

Figure 11B:
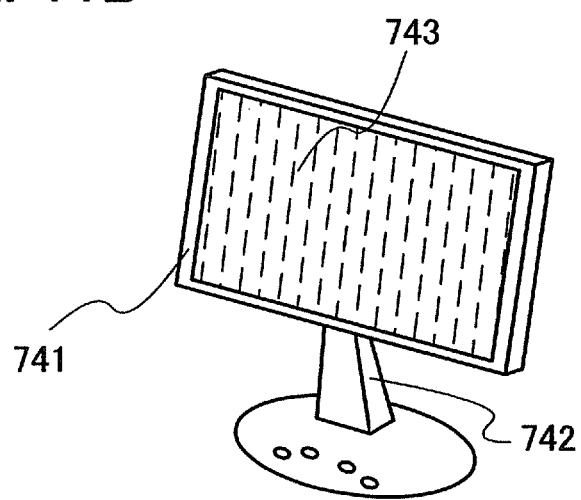

FIG. 11B illustrates a display device, and corresponds to a television receiver or the like. The display device includes a housing 741, a supporting base 742, a display portion 743, and the like.

Figure 12:
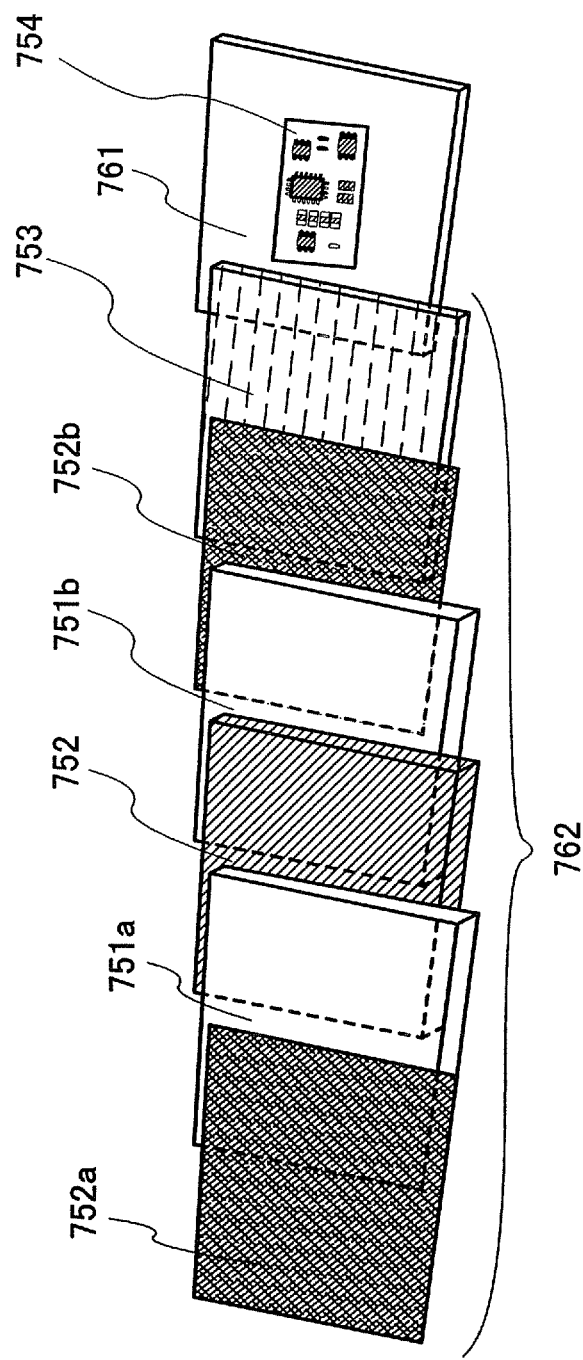
FIG. 12 illustrates a device on which a semiconductor device of the present invention is mounted.

FIG. 12 illustrates a detailed structure in the case of using a liquid crystal panel as a display portion 733 provided in a computer illustrated in FIG. 11A, and as the display portion 743 of the display device illustrated in FIG. 11B.

A liquid crystal panel 762 illustrated in FIG. 12 is incorporated in a housing 761 and includes substrates 751a and 751b, a liquid crystal layer 752 interposed between the substrates 751a and 751b, polarizing filters 752a and 752b, a backlight 753, and the like. A housing 761 is provided with a photoelectric conversion device 754.

The photoelectric conversion device 754 which is manufactured using the present invention detects the amount of light from the backlight 753, and the information is fed back to adjust the luminance of the liquid crystal panel 762.

Figure 13A:
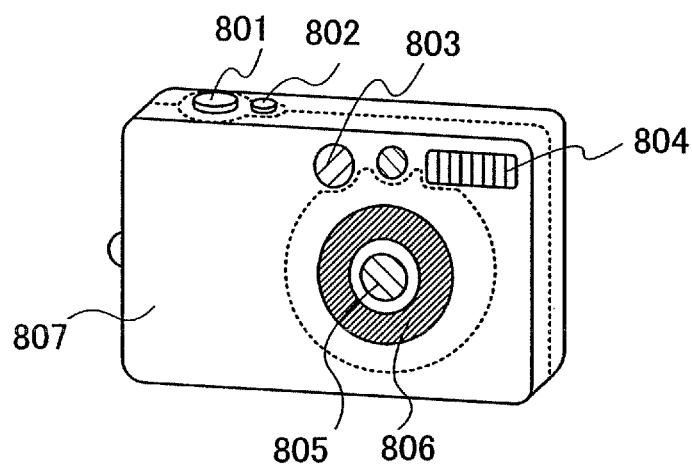
FIGS. 13A and 13B illustrate a device on which a semiconductor device of the present invention is mounted.
Figure 13B:
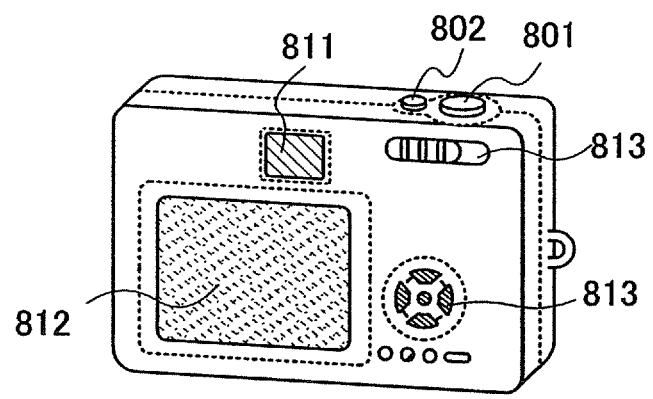

FIGS. 13A and 13B are views each illustrating an example in which the photoelectric conversion device of the present invention is incorporated in a camera such as a digital camera. FIG. 13A is a front perspective view seen from the front side of the digital camera, and FIG. 13B is a back perspective view seen from the back side of the digital camera. In FIG. 13A, the digital camera is provided with a release button 801, a main switch 802, a viewfinder 803, a flush portion 804, a lens 805, a lens barrel 806, and a housing 807.

In addition, in FIG. 13B, a viewfinder eyepiece 811, a monitor 812, and operation buttons 813 are provided.

When the release button 801 is pressed down halfway, a focusing adjusting mechanism and an exposure adjusting mechanism are operated, and when the release button is pressed down fully, a shutter is opened.

The main switch 802 switches on or off of a power source of a digital camera by being pressed or rotated.

The viewfinder 803 is placed at the upper section of the lens 805 of a front side of the digital camera, and is a device for recognizing an area which is taken or a focus position from the viewfinder eyepiece 811 illustrated in FIG. 13B.

The flush portion 804 is placed at the upper section of the front side of the digital camera, and when object luminance is low, supporting light is emitted at the same time as the release button is pressed down so that the shutter is opened.

The lens 805 is placed at the front face of the digital camera. The lens is formed of a focusing lens, a zoom lens, or the like, and forms a photographing optical system with a shutter and aperture that are not illustrated. Note that an image pickup device such as charge coupled device (CCD) is provided at the rear of the lens.

The lens barrel 806 moves a lens position to adjust the focus of the focusing lens, the zoom lens, and the like. When shooting, the lens barrel is slid out to move the lens 805 forward. In addition, when carrying the camera, the lens 805 is moved backward so as to make the camera compact. Note that a structure is employed in this embodiment mode, in which the lens barrel is slid out so that the object can be shot by being zoomed; however, the present invention is not limited the structure. Instead, a digital camera may employ a structure in which zoom shooting can be conducted without sliding out the lens barrel by a photographing optical system inside the housing 807.

The viewfinder eyepiece 811 is provided at the upper section of the rear side of the digital camera, for looking through when checking an area which is taken or a focus point.

The operation buttons 813 are buttons for various functions that are provided at the rear side of the digital camera and include a set up button, a menu button, a display button, a functional button, a selection button and the like.

When the photoelectric conversion device of the present invention is incorporated in the camera illustrated in FIGS. 13A and 13B, the photoelectric conversion element can detect the light intensity and whether light exists or not; accordingly, an exposure adjustment or the like of the camera can be performed. With the photoelectric conversion device of the present invention, the number of field effect transistor included in the photoelectric conversion circuit can be reduced, and the packaging area can be reduced, whereby the device can be miniaturized. Miniaturization of a component like an optical sensor provided with a photoelectric conversion circuit is effective particularly when the component is used for portable electronic devices.

In addition, the photoelectric conversion device of the present invention can also be applied to other electronic devices such as a projection TV and a navigation system, for example. In other words, the photoelectric conversion device of the present invention can be applied to anything that is necessary to detect light.

Note that this embodiment mode can be implemented in combination with any of technical elements of the other embodiment modes in this specification.

Embodiment Mode 5

In this embodiment mode, an example of a structure in which a semiconductor device which functions as a color sensor includes a substrate which is provided with a black matrix, a color filter, and the like is described with reference to FIGS. 16A to 16 C.

Figure 16A:
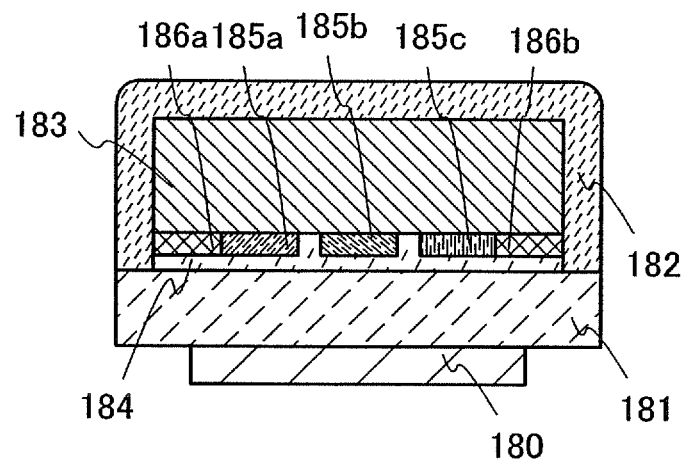
FIGS. 16A to 16C illustrate a manufacturing step of a semiconductor device of the present invention.

The semiconductor device illustrated in FIG. 16A includes a photoelectric conversion element 180, a substrate 181 which is divided from a large-sized substrate, a resin layer 182, and a substrate 183 provided with an insulating layer 184, coloring layers 185a, 185b, and 185c, and light-shielding layers 186a, and 186b.

The coloring layers 185a, 185b, and 185c function as a color filter, and each color layer has a different color, which is red (R), green (G), or blue (B). The light-shielding layers 186a and 186b have a function as a black matrix and a function to shield the coloring layers 185a, 185b, and 185c and the photoelectric conversion element 180 from external light which is unintentionally delivered in order to prevent malfunction. Note that the coloring layers and the light-shielding layers may be formed on the substrate 181 side.

The resin layer 182 is formed in contact with a part of the substrate 181 to cover the substrate 183 provided with the insulating layer 184, the coloring layers 185a, 185b, and 185c, and the light-shielding layers 186a and 186b. In FIG. 16A, a semiconductor device can be formed as follows: after the substrate 181 and the substrate 183 are attached each other with the insulating layer 184 interposed therebetween, a groove is formed in such a manner that a part of the substrate 183 and a part of the insulating layer 184 are removed for division: and then, the resin layer 182 is formed, and the resin layer 182 and the substrate 181 are divided. Alternatively, before the substrate 181 and the substrate 183 are attached each other with the insulating layer 184 interposed therebetween, the substrate 183 and the insulating layer 184 are divided, and the divided substrate 183 and insulating layer 184 may be attached to the substrate 181.

Figure 16B:
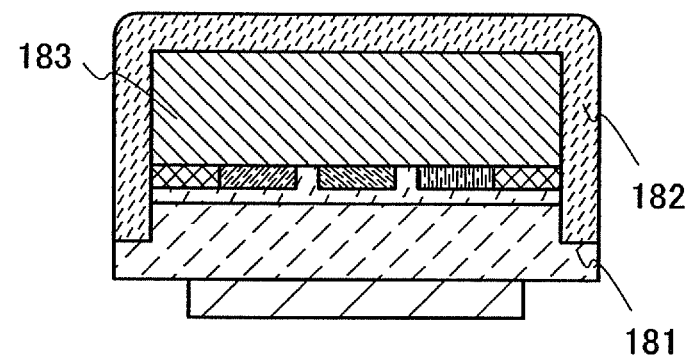

FIG. 16B illustrates an example in which a part of the substrate 181 is removed to form a groove, and the resin layer 182 covers part of the side surface of the substrate 181 in FIG. 16A.

Figure 16C:
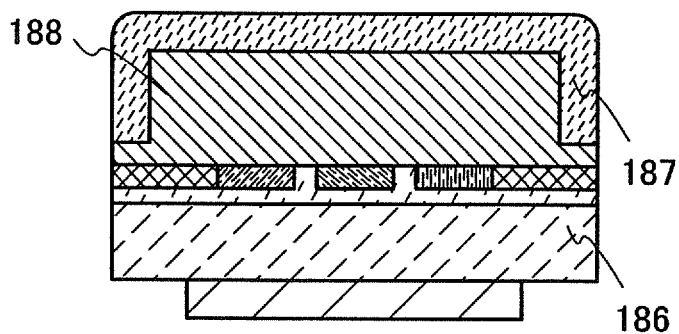

FIG. 16C illustrates an example in which the substrate 183 is removed so as to leave a part of it in order to form a groove, and the resin layer 182 covers only a part of the side surface of the substrate 183 in FIG. 16A.

As thus described, one semiconductor device can be provided with color filters having a plurality of colors. A semiconductor device including a photoelectric conversion element is formed by using the present invention, and thus a color sensor can be formed with low unit cost and with high yield.

Note that this embodiment mode can be implemented in combination with any of technical elements of the other embodiment modes in this specification.

Embodiment 1

In Embodiment 1, a cross-section of an element which is formed by the present invention is described with reference to a photomicrograph.

Here, an example in which a photoelectric conversion element is formed as Embodiment Mode 1 is described. Note that the large-sized substrate 161 of 0.5 mm in thickness was polished to 0.25 mm in thickness by a CMP method. In the step for providing a groove, a groove of approximately 0.03 to 0.05 mm in depth was formed by using a dicing blade of 0.16 mm in width. Then, acrylic of 6 μm in thickness was formed. Then, in the dividing step, the large-sized substrate 161 was divided using a dicing blade of 0.1 mm in thickness.

Figure 14A:
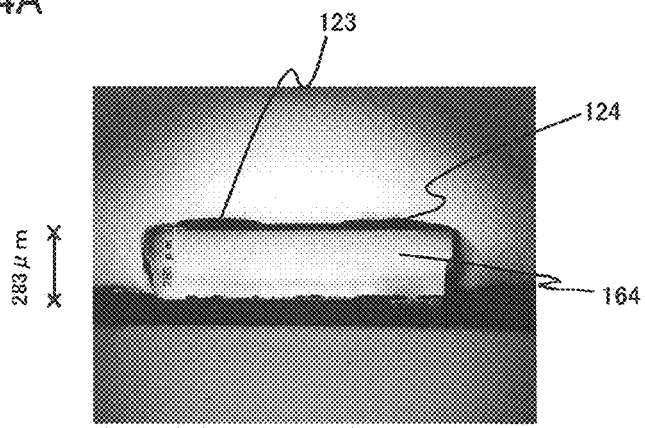
FIGS. 14A to 14C are cross-sectional photographs of a semiconductor device of the present invention.

FIG. 14A illustrates a cross-section of the substrate 164 which is formed by division. The substrate 164 is provided with a photoelectric conversion element, and there are the terminal electrode 123 and the terminal electrode 124 over the substrate 164. Although the thickness of the substrate 164 had been planed to be 0.25 mm, that is 250 µm, the thickness in real was 283 µm. Note that the reduced scale is illustrated on the left side of the photos of FIGS. 14A to 14C.

Figure 14B:
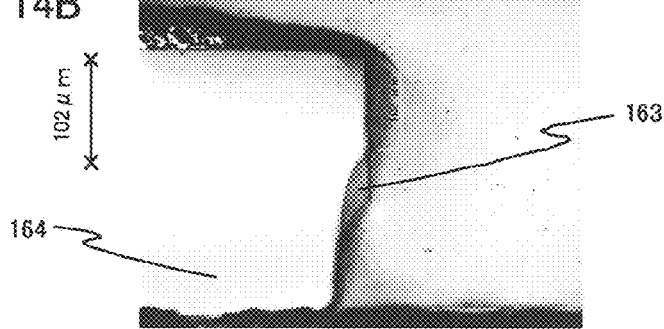

FIG. 14B illustrates a cross-section of the end portion of the substrate 164. The resin layer 163 is formed on the end portion. The resin layer 163 is formed thick at the lower half in the thickness direction of the glass and formed to a thickness of 30 µm locally. The resin layer 163 has a rounded curve which curves inwardly like a protrusion. On the side surface in the upper half of the substrate, that is the side surface near to the surface over which the terminal electrode 123 is formed, the dicing blade has been touched to the substrate in the step for dividing, so that the resin layer 163 is not formed.

Figure 14C:

FIG. 14C illustrates a bottom surface of the substrate 164, that is, a cross-section of the surface opposite to the surface over which the terminal electrode 123 is formed. Although the thickness of the resin layer 163 had been planed to be 6 µm, here the thickness in real was 6.4 µm.

Thus, in the semiconductor device of the present invention, a semiconductor element is formed on a first surface of the substrate. A resin layer is formed over a second surface of the substrate which is opposite to the first surface of the substrate and on a part of the side surface of the substrate. A step is formed on the side surface of the substrate. The width of the upper section of the substrate with a step is narrower than the lower section of the substrate with a step. Therefore, the substrate can have a protrusion. The cross-section of the substrate can also be described as an upside-down T shape. The upside-down T shape has only to substantively have a shape like T.

Alternatively, in the semiconductor device of the present invention, a semiconductor element is formed on a first surface of the substrate. A resin layer is formed over a second surface of the substrate opposite to the first surface of the substrate and on a part of the side surface of the substrate. The cross-section of the substrate is a trapezoid with a stepped side surface, and the thickness of the upper section of the stepped trapezoid is larger than that of the lower section of it. Depending on the shape of a groove, the trapezoid curves from the upper section to the lower section.

In the above structure, in one mode of the semiconductor device, a side surface of the substrate in contact with a resin includes a curved surface which spreads toward the bottom. In addition, a bottom surface of the substrate and a top surface of the substrate are quadrangles, and the area of the bottom surface is larger than the area of the top surface.

As thus described, since the semiconductor device of the present invention has a complicated shape, top, bottom, right, and left sides of the semiconductor device is easily distinguished. Thus, misidentification even in an automatic operation by a machine can be reduced.

As thus described, the substrate 164 provided with the resin layer 163 can be relieved from physical shock, and scratch and a crack of appearance can be reduced. Thus, manufacturing yield of the element can be increased.

This application is based on Japanese Patent Application serial No. 2007-340013 filed with Japan Patent Office on Dec. 28, 2007, the entire contents of which are hereby incorporated by reference.

What is claimed is:

1. A method for manufacturing a semiconductor device, comprising:

forming a semiconductor element including a transistor including a gate electrode and a semiconductor film on a first surface of a glass substrate;

thinning the substrate from a second surface side opposite to the first surface to form a thinned substrate having a third surface opposite to the first surface;

forming a first groove on the third surface side and in the thinned substrate;

forming a first resin layer over the third surface and the first groove, wherein a second groove of the first resin layer is provided in the first groove; and dividing the thinned substrate, wherein a bottom surface of the second groove is provided over a bottom surface of the first groove, wherein a side surface of the divided substrate in a cross-section has a first side surface which is covered with the first resin layer and a second side surface which is exposed, and wherein the first side surface is curved.

2. The method for manufacturing a semiconductor device according to claim 1, wherein in forming the first groove and in dividing the substrate, dicing blades which have different thicknesses are used.

3. The method for manufacturing a semiconductor device according to claim 1, wherein the substrate is fixed with a piece of dicing tape in thinning the substrate, in forming the first groove, and in dividing the substrate.

4. The method for manufacturing a semiconductor device according to claim 1, wherein in dividing the substrate, a marker provided on the thinned substrate is detected, and an inside of the first groove is cut and divided while a position of the thinned substrate is checked.

5. The method for manufacturing a semiconductor device according to claim 1, wherein the semiconductor element is a photoelectric conversion element.

6. The method for manufacturing a semiconductor device according to claim 1, further comprising a step of forming a second resin layer over the first resin layer.

7. The method for manufacturing a semiconductor device according to claim 1, wherein a width of the first groove formed in forming the first groove is larger than a width of a cutting trace in dividing the thinned substrate.

8. A method for manufacturing a semiconductor device, comprising:

forming a semiconductor element including a transistor including a gate electrode and a semiconductor film on a first surface of a glass substrate;

forming a first groove on a second surface side of the substrate opposite to the first surface and in the substrate;

forming a first resin layer over the second surface and the first groove, wherein a second groove of the first resin layer is provided in the first groove; and dividing the substrate, wherein a bottom surface of the second groove is provided over a bottom surface of the first groove, wherein a side surface of the divided substrate in a cross-section has a first side surface which is covered with the first resin layer and a second side surface which is exposed, and wherein the first side surface is curved.

9. The method for manufacturing a semiconductor device according to claim 8, wherein the substrate is fixed with a piece of dicing tape in forming the first groove and in dividing the substrate.

10. The method for manufacturing a semiconductor device according to claim 8, wherein in dividing the substrate, a marker provided on the substrate is detected, and an inside of the first groove is cut and divided while a position of the substrate is checked.

11. The method for manufacturing a semiconductor device according to claim 8, wherein the semiconductor element is a photoelectric conversion element.

12. The method for manufacturing a semiconductor device according to claim 8, further comprising a step of forming a second resin layer over the first resin layer.

13. The method for manufacturing a semiconductor device according to claim 8,
wherein a width of the first groove formed in forming the first groove is larger than a width of a cutting trace in dividing the substrate.

* * * * *